United States Patent
Nowak et al.

(10) Patent No.: US 8,559,099 B2
(45) Date of Patent: Oct. 15, 2013

(54) LASER BEAM AMPLIFIER AND LASER APPARATUS USING THE SAME

(75) Inventors: Krzysztof Nowak, Oyama (JP); Masato Moriya, Oyama (JP); Osamu Wakabayashi, Hiratsuka (JP)

(73) Assignee: Gigaphoton Inc., Tochigi (JP)

( * ) Notice: Subject to any disclaimer, the term of this patent is extended or adjusted under 35 U.S.C. 154(b) by 610 days.

(21) Appl. No.: 12/685,246

(22) Filed: Jan. 11, 2010

(65) Prior Publication Data

US 2010/0195196 A1     Aug. 5, 2010

(30) Foreign Application Priority Data

Jan. 14, 2009  (JP) ................................. 2009-005771

(51) Int. Cl.
*H01S 3/082* (2006.01)
*H01S 3/22* (2006.01)

(52) U.S. Cl.
USPC ............................... 359/346; 372/55; 372/61

(58) Field of Classification Search
USPC ...................................... 359/346; 372/55, 61
See application file for complete search history.

(56) References Cited

U.S. PATENT DOCUMENTS

| | | | |
|---|---|---|---|
| 4,264,868 A * | 4/1981 | Leland et al. ................. | 359/342 |
| 4,622,675 A * | 11/1986 | Penn ................................ | 372/58 |
| 4,910,749 A * | 3/1990 | Karube .......................... | 372/87 |
| 4,918,395 A * | 4/1990 | Difonzo et al. ................ | 359/346 |
| 5,303,254 A * | 4/1994 | Szatmari ....................... | 372/87 |
| 5,353,299 A * | 10/1994 | Martinen et al. ................ | 372/99 |
| 5,386,431 A | 1/1995 | Tulip | |
| 6,061,377 A * | 5/2000 | Brassart et al. .................. | 372/66 |
| 7,439,530 B2 * | 10/2008 | Ershov et al. ............. | 250/504 R |
| 2002/0167974 A1 * | 11/2002 | Kennedy et al. ................. | 372/10 |
| 2005/0220164 A1 * | 10/2005 | Mori et al. ....................... | 372/92 |

* cited by examiner

*Primary Examiner* — Eric Bolda

(74) *Attorney, Agent, or Firm* — McDermott Will & Emery LLP

(57) ABSTRACT

A laser beam amplifier with high optical axis stability is provided. The laser beam amplifier includes: a container for accommodating a laser medium; a pair of electrodes for performing discharge in the laser medium to form an amplification region for a laser beam in the laser medium; and an optical system for forming an optical path between a first point, upon which the laser beam is incident, and a second point, from which the laser beam is outputted, such that the amplification region is located in the optical path between the first point and the second point, wherein the first point and the second point are conjugate to each other, and the laser beam incident upon the first point is amplified while passing through the amplification region at least twice and then transferred to the second point.

10 Claims, 18 Drawing Sheets

25 DISCHARGE TUBE
24b, 22b, 47, 37
INCIDENT BEAM
46
23b
43
OUTPUT BEAM
26 LASER GAS CIRCULATION PUMP
27 HEAT EXCHANGER

◄----- GAS FLOW DIRECTION

22b — 25 DISCHARGE TUBE
DISCHARGE REGION
23b
24b
RADIO-FREQUENCY POWER SUPPLY

22b — 25 DISCHARGE TUBE
DISCHARGE REGION
23b
24b
RADIO-FREQUENCY POWER SUPPLY

UNIFORM DISCHARGE REGION

INCIDENT BEAM POSITION 34 (FIRST POINT)
35 INCIDENT BEAM SECOND TRANSFER IMAGE POSITION (SECOND POINT)
39 INCIDENT BEAM FIRST TRANSFER IMAGE POSITION (THIRD POINT)
30 AMPLIFICATION REGION
21 CHAMBER

INCIDENT BEAM SECOND TRANSFER IMAGE POSITION (SECOND POINT)
34 INCIDENT BEAM POSITION (FIRST POINT)
39 INCIDENT BEAM FIRST TRANSFER IMAGE POSITION (THIRD POINT)

34 INCIDENT BEAM POSITION (FIRST POINT)
35 INCIDENT BEAM TRANSFER IMAGE POSITION (SECOND POINT)
21 CHAMBER
30 AMPLIFICATION REGION

34 INCIDENT BEAM POSITION (FIRST POINT)
35 INCIDENT BEAM TRANSFER IMAGE POSITION (SECOND POINT)

33
34 INCIDENT BEAM POSITION
(FIRST POINT)

30 AMPLIFICATION REGION    21 CHAMBER

35
INCIDENT BEAM
TRANSFER IMAGE POSITION
(SECOND POINT)

34 INCIDENT BEAM POSITION
(FIRST POINT)

35
INCIDENT BEAM TRANSFER IMAGE POSITION
(SECOND POINT)

LASER BEAM AMPLIFIER AND LASER APPARATUS USING THE SAME

CROSS-REFERENCE TO RELATED APPLICATION

The present application claims priority from Japanese Patent Application No. 2009-005771 filed on Jan. 14, 2009, the contents of which are incorporated herein by reference in their entirety.

BACKGROUND OF THE INVENTION

1. Field of the Invention

The present invention relates to a laser beam amplifier for amplifying a seed laser beam, and a laser apparatus using the laser beam amplifier. Especially, the present invention relates to a driver laser apparatus for irradiating a target material with a laser beam to turn the target material into plasma in an extreme ultraviolet (EUV) light source apparatus.

2. Description of a Related Art

In recent years, as semiconductor processes become finer, photolithography has been making rapid progress toward finer fabrication. In the next generation, microfabrication at 60 nm to 45 nm, further, microfabrication at 32 nm and beyond will be required. Accordingly, for example, exposure equipment is expected to be developed by combining an EUV light source for generating EUV light having a wavelength of about 13 nm and reduced projection reflective optics.

As the EUV light source, there is an LPP (laser produced plasma) light source using plasma generated by irradiating a target with a laser beam (hereinafter, also referred to as "LPP type EUV light source apparatus"). The LPP type light source apparatus irradiates a target material, for example, tin (Sn) supplied into a vacuum chamber with a driver laser beam to excite the target material and generate plasma. From the generated plasma, various wavelength components including EUV light are radiated, and a desired EUV component among them is selectively collected by using a collector mirror (EUV collector mirror) and outputted to a device using EUV light such as an exposure unit.

The output higher than 100 W is requested for the EUV light source. For example, even in the case of an EUV light source for generating EUV light relatively efficiently by using a carbon dioxide ($CO_2$) laser apparatus and a tin (Sn) target, higher efficiency of the $CO_2$ laser apparatus for outputting a driver laser beam for plasma generation is required for use in industrial application.

As the driver laser beam for plasma generation, a pulse laser beam is used, and therefore, a master oscillator power amplifier type laser to be used as a driver laser apparatus includes, for example, a laser oscillator for generating a short-pulse $CO_2$ laser beam and a laser beam amplifier for amplifying the short-pulse $CO_2$ laser beam.

The laser beam amplifier has a discharging unit for exciting a $CO_2$ laser gas containing carbon dioxide ($CO_2$), nitrogen ($N_2$), helium (He), and additionally, according to need, hydrogen ($H_2$), carbon monoxide (CO), xenon (Xe), and so on by discharge. In the laser beam amplifier, a seed laser beam generated by the laser oscillator is amplified into a laser beam having desired energy. The amplified laser beam is focused by a laser beam focusing optics and applied to a target material such as tin (Sn), xenon (Xe), or the like.

U.S. Patent Publication US005386431A discloses a regenerative amplifier laser array for performing multipass amplification. FIG. 26 shows a laser beam amplifier disclosed in US005386431A. The laser beam amplifier as shown in FIG. 26 employs a multipass system in which an incident seed laser beam travels back and forth in a laser medium at plural times, and thereby, a large amplification factor can be achieved by efficiently utilizing the energy of the laser medium. Therefore, downsizing of a driver laser apparatus incorporating the laser beam amplifier can be realized.

In the multipass amplification type laser beam amplifier as shown in FIG. 26, it is necessary to make the optical path of the seed laser beam within the discharge region longer in order to improve the amplification efficiency. Accordingly, the optical system is constructed such that the seed laser beam is reflected by a rear mirror and a front mirror at multiple times to make the optical path of the laser beam within the discharge region longer.

However, since the optical path length becomes up to ten meters in the conventional multipass amplification type laser beam amplifier, if the optical axis of the seed laser beam in the incident position is slightly shifted relative to the reference optical axis as shown in FIG. 27, an error between the optical axes (a difference between the reference optical axis and the shifted optical axis) increases during reflection and amplification of the seed laser beam. As a result, the laser beam amplification is not efficiently performed due to the large shift of the optical axis of the laser beam to be amplified, and the output after amplification becomes lower. In the case where the optical axis is more largely shifted, the laser beam may be out of the exit window and not outputted from the laser beam amplifier as shown by dotted lines in FIG. 27.

Therefore, the configuration of the laser apparatus using the multipass amplification type laser beam amplifier has been extremely difficult for the following reasons: (1) it is difficult to properly provide the laser beam amplifier in the optical path of the seed laser beam; (2) it is difficult to correctly guide the seed laser beam to the provided laser beam amplifier; and (3) it is difficult to accurately make optical alignment of the entire laser apparatus. Further, even if the configuration of the laser apparatus is properly formed, the optical path within the laser beam amplifier is largely shifted from the reference optical path due to the slight shift of the incident position or incident angle. Accordingly, the energy utilization efficiency in the discharge region becomes lower, and the amplification state becomes unstable. As a result, the position accuracy of the focusing point and the focusing ability of the amplified laser beam become deteriorated. Furthermore, in the case where the multipass amplification type laser beam amplifier is used in the driver laser apparatus of the EUV light source apparatus, the following problems occur. That is, when the position of the focusing point of the driver laser beam is largely shifted, the target material is not irradiated with the laser beam and EUV light is not generated. Even if the target material is irradiated with the laser beam, the energy of EUV light and the stability of the energy become lower.

SUMMARY OF THE INVENTION

The present invention has been achieved in view of the above-mentioned problems. A purpose of the present invention is to provide a laser beam amplifier with high optical axis stability. A further purpose of the present invention is to provide a laser apparatus, which incorporates a laser beam amplifier with high optical axis stability, for easy alignment and outputting a stable amplified pulse laser beam, especially, a driver laser apparatus for irradiating a target material with a laser beam to turn the target material into plasma in an EUV light source apparatus.

In order to accomplish the above-mentioned purposes, an laser beam amplifier according to one aspect of the present invention includes: a container for accommodating a laser medium; a pair of electrodes for performing discharge in the laser medium to form an amplification region for a laser beam in the laser medium; and an optical system for forming an optical path between a first point, upon which the laser beam is incident, and a second point, from which the laser beam is outputted, such that the amplification region is located in the optical path between the first point and the second point, wherein the first point and the second point are conjugate to each other, and the laser beam incident upon the first point is amplified while passing through the amplification region at least twice and then transferred to the second point.

Further, a laser apparatus according to one aspect of the present invention includes: a master oscillator for generating a pulse laser beam; a preamplifier including the laser beam amplifier according to the present invention, for amplifying the pulse laser beam supplied from the master oscillator to the first point, and outputting the amplified pulse laser beam from the second point; a first relay optics for adjusting a size and a spread angle of the pulse laser beam outputted from the preamplifier; a main amplifier for amplifying the pulse laser beam supplied from the preamplifier via the first relay optics; and a second relay optics for collimating the pulse laser beam outputted from the main amplifier to output parallel light.

In the laser beam amplifier according to the present invention, the optical path between the first point and the second point is formed such that the amplification region is located in the optical path between the first point and the second point, which are conjugate to each other, and the laser beam incident upon the first point is amplified while passing through the amplification region at least twice and then transferred to the second point. Therefore, the image of the laser beam incident upon the first point is transferred to the second point and the transfer image is focused. As a result, the error of the optical axis is not largely extended, and the errors of the position and the incident angle of the laser beam relative to the reference optical path in the incident position are substantially equal in the exit position.

Further, since the laser beam amplifier has high optical path stability, the error of the optical axis relative to the reference optical path is suppressed and the energy utilization efficiency is not reduced in the entire laser apparatus. In the case where optical adjustment is performed between the laser beam amplifier and another optics, the optical adjustment can be performed easily and correctly by using the first point and the second point as references of the optical axis. Therefore, by focusing the amplified pulse laser beam with high light intensity outputted from the laser apparatus according to the present invention on the plasma emission point of the LPP type EUV light source apparatus, EUV light can be generated with high efficiency and the stability of the energy of the EUV light can be improved.

DESCRIPTION OF THE PREFERRED EMBODIMENTS

Figure 1:
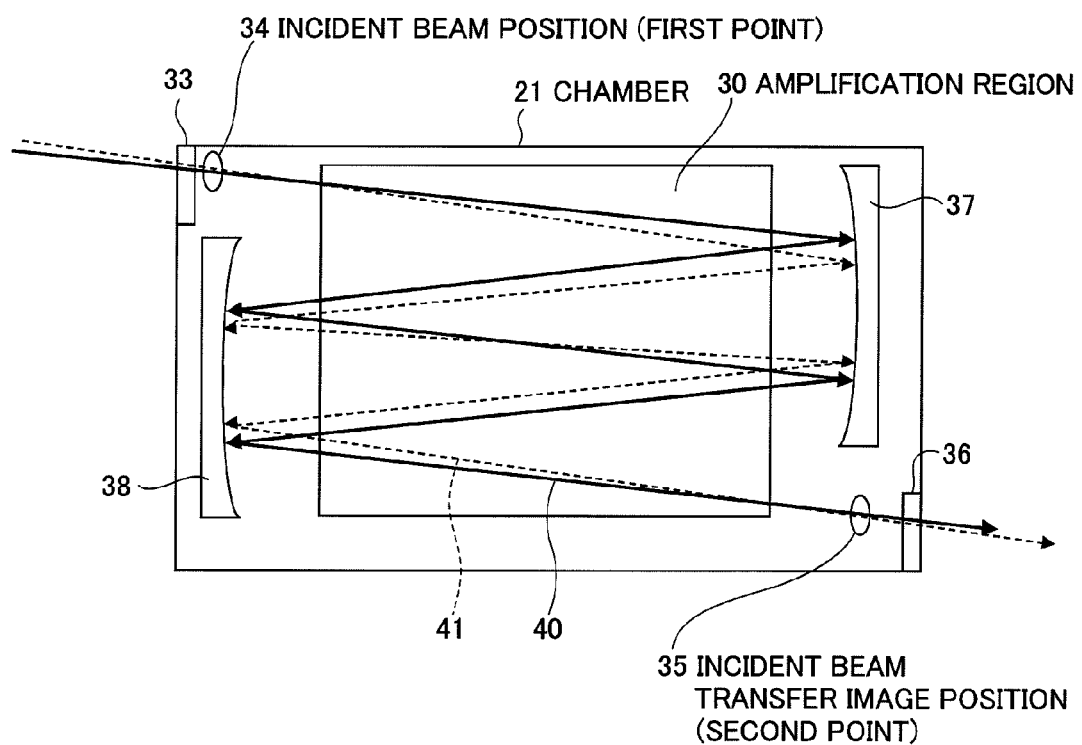
FIG. 1 shows a configuration of a laser beam amplifier according to the first embodiment of the present invention.

Hereinafter, preferred embodiments of the present invention will be explained in detail by referring to the drawings. The same reference characters are assigned to the same component elements and the explanation thereof will be omitted.

(Embodiment 1)

FIG. 1 shows a configuration of a laser beam amplifier according to the first embodiment of the present invention, and shows the case where the present invention is applied to a slab type laser beam amplifier in order to explain the principle of the present invention in an easy-to-understand way.

As shown in FIG. 1, the laser beam amplifier according to the first embodiment includes a chamber 21 as a container for accommodating a laser medium, a pair of electrodes for performing discharge in the laser medium to form an amplification region 30 for a laser beam in the laser medium, and an optical system having a pair of reflective mirrors 37 and 38 arranged to face each other with the amplification region 30 in between, and the laser beam amplifier performs multipass amplification. The chamber 21 is provided with an entrance window 33 through which a laser beam is incident and an exit window 36 through which the laser beam is outputted. As the laser medium, for example, a $CO_2$ laser gas containing carbon dioxide ($CO_2$), nitrogen ($N_2$), helium (He), and additionally, according to need, hydrogen ($H_2$), carbon monoxide (CO), xenon (Xe), and so on is used.

Figure 2:
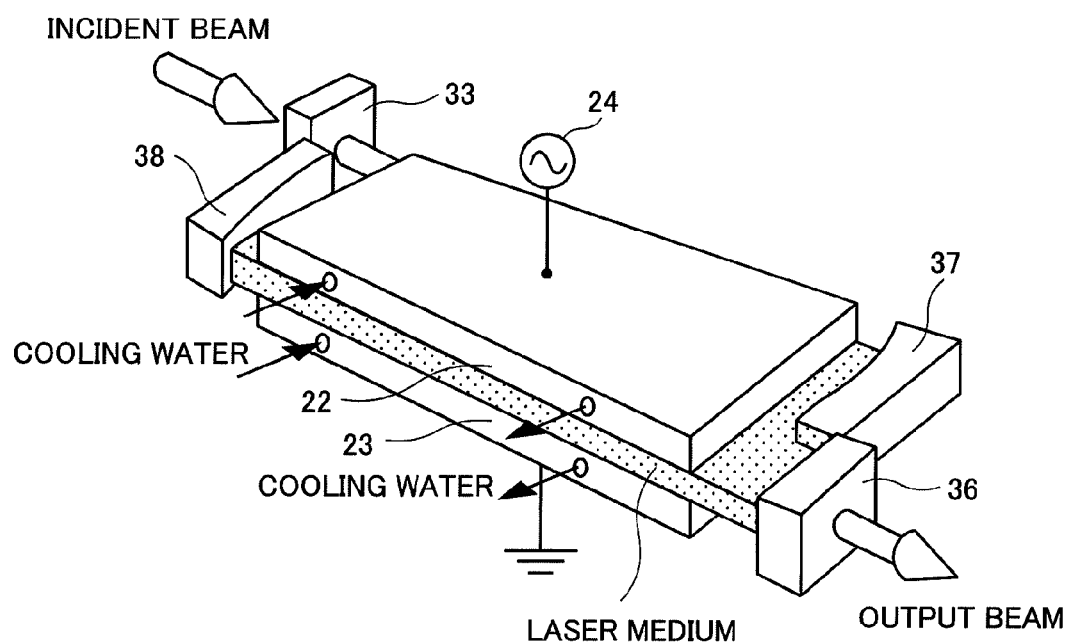
FIG. 2 is a perspective view showing a structure within a chamber of the laser beam amplifier as shown in FIG. 1.

FIG. 2 is a perspective view showing a structure within the chamber of the laser beam amplifier as shown in FIG. 1. As shown in FIG. 2, a pair of plate electrodes 22 and 23 are arranged to sandwich the laser medium enclosed within the chamber. When a radio-frequency (RF) power supply 24 applies a radio-frequency voltage between the plate electrode 22 and the plate electrode 23, the plate electrodes 22 and 23 generate a radio-frequency electric field to perform radio-frequency discharge in the laser medium. Thereby, the laser medium is excited and a seed laser beam (incident beam) entering the chamber via the entrance window 33 is amplified. The seed laser beam is reflected by the reflective mirrors 37 and 38 while being amplified, and then, outputted as an output beam from the exit window 36 to the outside of the chamber.

Here, the amplification region for the laser beam is a discharge region sandwiched between the plate electrode 22 and the plate electrode 23. By applying the radio-frequency voltage between the plate electrode 22 and the plate electrode 23, a part of the laser medium filling the chamber, which part is sandwiched between the plate electrode 22 and the plate electrode 23, is excited, and a slab-shaped discharge region is formed. The gap between the plate electrode 22 and the plate electrode 23 is about 0.5 mm to 2 mm, and the section of the discharge region has a thin rectangular shape. For cooling the plate electrodes 22 and 23 and the laser medium, cooling water is supplied to the plate electrodes 22 and 23.

Referring to FIG. 1 again, the reflective mirrors 37 and 38 are concave HR (high-reflection) mirrors having focusing ability and highly reflecting the laser beam, and arranged to face each other with the amplification region 30 in between. For example, the reflective mirrors 37 and 38 are placed with a slight shift in the vertical direction in FIG. 1 such that the line connecting the center of the reflection surface and the center of curvature of the reflective mirror 37 and the line connecting the center of the reflection surface and the center of curvature of the reflective mirror 38 are in parallel to each other. Thereby, the incident beam passes through the side of the reflective mirror 38 and enters the reflective mirror 37, and the output beam passes through the side of the reflective mirror 37 and is outputted.

The seed laser beam incident to the laser beam amplifier is transmitted through the entrance window 33 to enter the chamber 21 and passes through an incident beam position 34 along a reference optical path 40 as shown by solid lines in FIG. 1. The incident beam position 34 is a predetermined first point in the optical path. The seed laser beam that has passed through the incident beam position (first point) 34 is amplified while passing through the amplification region 30, incident upon the reflective mirror 37 and reflected at high reflectivity, amplified while passing through the amplification region 30 again, and reflected at high reflectivity by the opposed reflective mirror 38.

The laser beam reflected by the reflective mirror 38 is amplified while passing through the amplification region 30 again, reflected by the reflective mirror 37 again, amplified while passing through the amplification region 30, reflected by the reflective mirror 38, transmitted through the exit window 36, and outputted from the laser beam amplifier. At that time, the image of the incident beam at the first point 34 is transferred to a predetermined second point 35 near the location where the reference optical path 40 passes through the side of the reflective mirror 37, and an incident beam transfer image is formed.

As described above, an optical system including the reflective mirrors 37 and 38 forms an optical path between the first point 34, upon which the laser beam is incident, and the second point 35, from which the laser beam is outputted, such that the amplification region 30 is located in the optical path between the first point 34 and the second point 35, which are conjugate to each other, and the laser beam incident upon the first point 34 is amplified while passing through the amplification region 30 at least twice and then transferred to the second point 35. Here, it is desirable that the first point 34, upon which the laser beam is incident, is located near the entrance window 33 and the second point 35, from which the laser beam is outputted, is located near the exit window 36.

Assuming that an object is placed in the position of the first point 34, the first point 34 and the second point 35 correspond to an object point and an image point of the optical system including the reflective mirrors 37 and 38, and are determined based on the focusing ability and the spatial layout relation of the reflective mirrors 37 and 38. The positions of the first point 34 and the second point 35 are determined in advance, and thereby, the radii of curvature "R" and the locations of the reflective mirrors 37 and 38 can be determined corresponding to the positions.

In FIG. 1, the optical path 41 as shown by the dotted lines is an optical path when the optical axis (location and/or traveling direction) of the seed laser beam entering the laser beam amplifier is shifted from the reference optical path 40. In the case of using the optical system in which the first point 34 and the second point 35 are determined as described above, even when the optical axis of the seed laser beam is shifted from the reference optical path 40, the positional relationship between the incident beam and the first point 34 is reconstructed in the positional relationship between the output beam and the second point 35 from the relationship that the image of the incident beam at the first point 34 is transferred to the second point 35, and thereby, the optical axis of the amplified laser beam is not largely deviated from the reference optical path 40.

Thus, in the laser beam amplifier according to the embodiment, even when the optical axis of the incident beam has some error relative to the reference optical path 40, the optical axis of the output beam has only the equal error to the error relative to the reference optical path 40 in the incident position. Accordingly, the stability of the optical axis is improved, the amplification efficiency does not greatly vary, and the seed laser beam can stably be amplified. As a result, the position and the focus shape of the focusing point become stable.

Particularly, it is desirable that the transfer magnification of the incident beam transfer image is substantially "1". In the case where the transfer magnification is "1", even when the position of the incident beam at the first point 34 has an error relative to the reference optical path 40, the position of the output beam at the second point 35 has only substantially the same error relative to the reference optical path 40. That is, the position error of 1 mm at the first point 34 produces only the position error of 1 mm at the second point 35.

Further, even when the angle of the incident beam at the first point 34 has an error relative to the reference optical path 40, the angle of the output beam at the second point 35 has only substantially the same error relative to the reference optical path 40. For example, in a conventional laser beam amplifier having an optical path length of 30 m in 10 passes, assuming that the incident position is the reference position and only the incident angle has an error of 1 mRad relative to the reference optical path 40, the exit position has a position error of about 30 mm relative to the reference optical path 40. On the other hand, in the laser beam amplifier according to the embodiment, the output beam passes the second point 35 in the reference optical path 40 without fail, and the output beam having an error of the exit angle of 1 mRad relative to the reference optical path 40 is outputted.

As described above, the laser beam amplifier according to the embodiment has a great advantage in optical axis stabilization. Further, the optical path of the laser beam in the amplification region 30 is not largely shifted from the designed reference optical path 40, and thereby, the utilization efficiency of the energy stored in the laser medium is not reduced.

Furthermore, in the case where another optical element is connected at the upstream or the downstream on the optical axis, when the optical connection is made with reference to the first point 34 and the second point 35, the optical axis stabilization of the entire laser apparatus can be realized. For example, in the case where the seed laser beam generated by a master oscillator enters as the incident beam of the laser beam amplifier, the alignment of the laser beam outputted from the laser beam amplifier can easily be adjusted by adjusting the positional relationship and the angular relationship between the master oscillator and the laser beam amplifier such that the optical axis of the seed laser beam passes through the first point 34. Further, in the case where a relay optics for relaying the laser beam outputted from the laser beam amplifier is provided, the optical axis stabilization of the entire laser apparatus can be obtained by adjusting the positional relationship and the angular relationship between the laser beam amplifier and the relay optics such that the laser beam having the optical axis passing through the second point 35 enters the relay optics.

In the laser beam amplifier, the first point 34 and the second point 35 have the relationship of the object point and the image point and are conjugate to each other, and therefore, even when the input and the output of the laser beam amplifier are exchanged for use, it is optically equivalent if the transfer magnification is "1".

In the embodiment, the configuration, in which the amplification region 30 is provided between the pair of reflective mirrors 37 and 38, has been explained for ease of explanation. However, the present invention is not limited to this configuration as long as an optical system is provided in which the first point 34 and the second point 35 are conjugate to each other, and the laser beam incident upon the first point 34 is amplified while passing through the amplification region 30 at least twice and then transferred to the second point 35.

Figure 3:
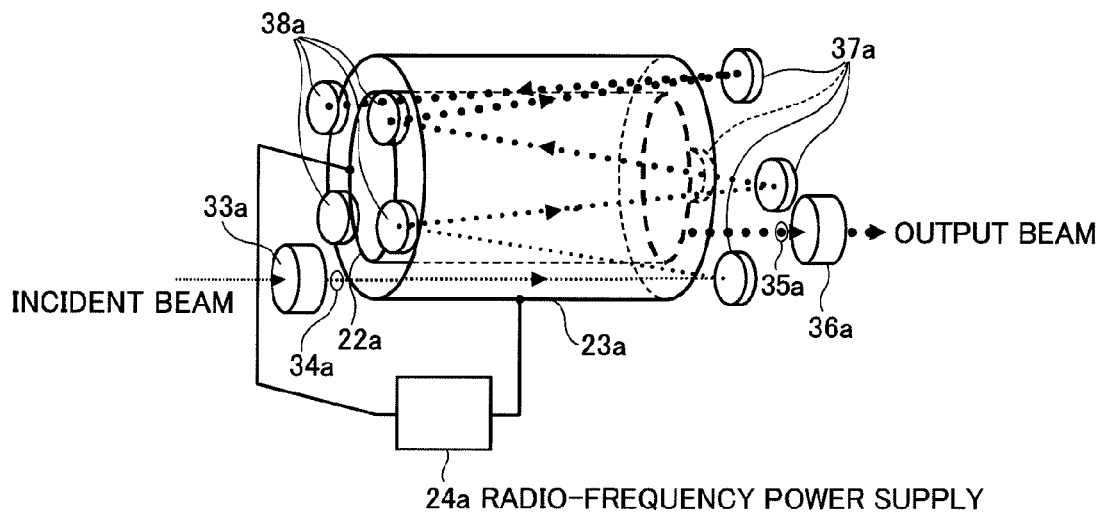
FIG. 3 is a perspective view showing a structure within a chamber of a laser beam amplifier according to a modified example of the first embodiment.

FIG. 3 is a perspective view showing a structure within a chamber of a laser beam amplifier according to a modified example of the first embodiment, and shows the case where the present invention is applied to a coaxial slab type laser beam amplifier.

As shown in FIG. 3, the laser beam amplifier according to the modified example of the first embodiment includes a pair of cylindrical electrodes 22a and 23a for forming an amplification region for a laser beam in the laser medium by performing discharge in the laser medium, and an optical system including a first group of reflective mirrors 37a and a second group of reflective mirrors 38a provided to face each other with the amplification region in between, in a chamber in which the laser medium is enclosed, and performs multipass amplification. In the chamber, an entrance window 33a, through which a laser beam is incident, and an exit window 36a, from which the laser beam is outputted, are provided.

Figure 4:
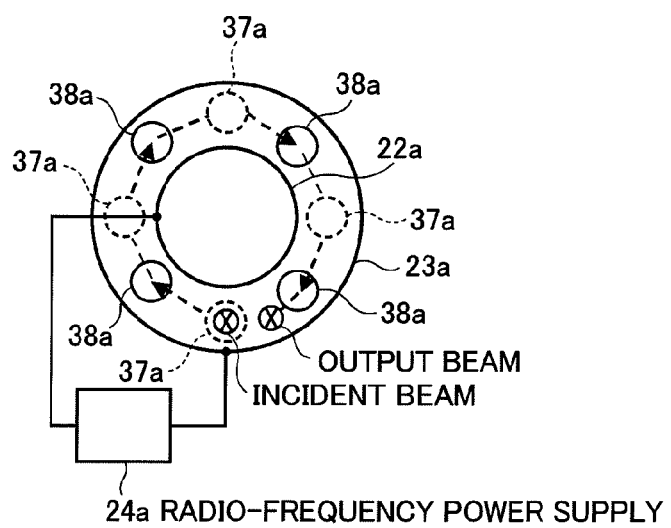
FIG. 4 is a front view for explanation of an operation of the laser beam amplifier as shown in FIG. 3.

FIG. 4 is a front view for explanation of an operation of the laser beam amplifier as shown in FIG. 3. As shown in FIG. 4, the pair of cylindrical electrodes 22a and 23a are coaxially provided. When a radio-frequency (RF) power supply 24a applies a radio-frequency voltage between the cylindrical electrode 22a and the cylindrical electrode 23a, the cylindrical electrodes 22 and 23 generate a radio-frequency electric field to perform radio-frequency discharge in the laser medium. Thereby, the laser medium is excited and a seed laser beam (incident beam) entering the entrance window 33a is amplified. The seed laser beam is reflected by the reflective mirrors 37a and 38a while being amplified, and then outputted as an output beam through the exit window 36a to the outside of the chamber.

Also in the modified example of the first embodiment, the optical system including the reflective mirrors 37a and 38a forms an optical path between a first point 34a, upon which the laser beam is incident, and a second point 35a, from which the laser beam is outputted, such that the amplification region is located in the optical path between the first point 34a and the second point 35a, which are conjugate to each other, and the laser beam incident upon the first point 34a is amplified while passing through the amplification region at least twice and then transferred to the second point 35a. Here, it is desirable that the first point 34a, upon which the laser beam is incident, is located near the entrance window 33a and the second point 35a, from which the laser beam is outputted, is located near the exit window 36a.

(Embodiment 2)

Figure 5:
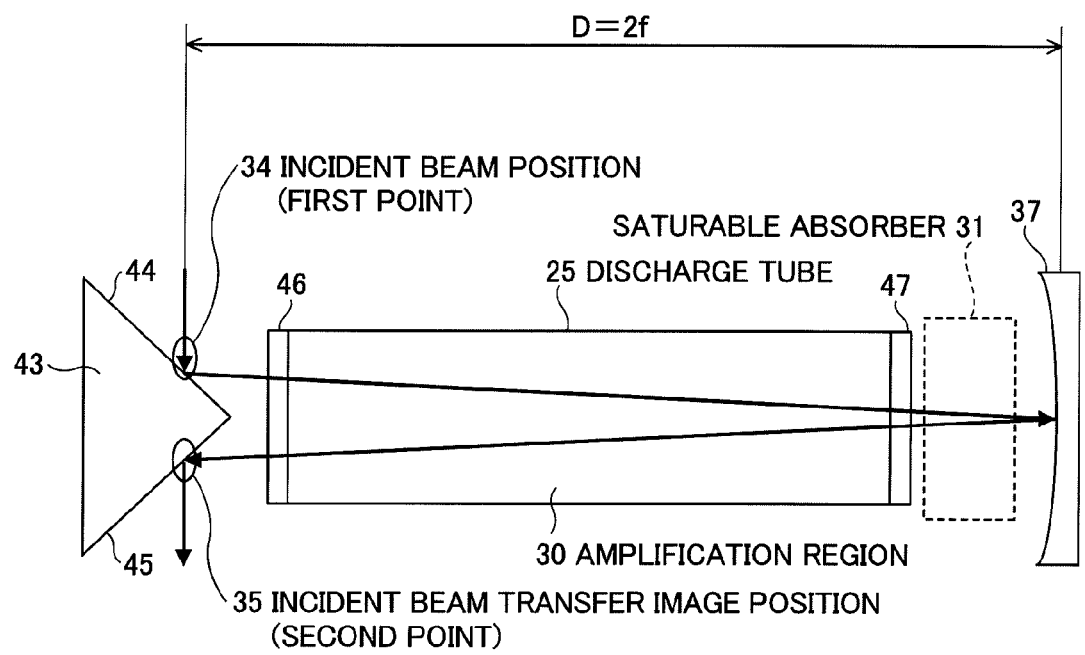
FIG. 5 shows a configuration of a laser beam amplifier according to the second embodiment of the present invention.

FIG. 5 shows a configuration of a laser beam amplifier according to the second embodiment of the present invention, and shows the case where the present invention is applied to a double-pass amplification type laser beam amplifier.

As shown in FIG. 5, the laser beam amplifier according to the second embodiment includes a discharge tube 25 for accommodating a laser medium, a pair of electrodes for performing discharge in the laser medium to form an amplification region 30 for a laser beam in the laser medium, an optical system including a concave HR mirror 37 and an HR mirror prism 43 provided to face each other with the amplification region 30 in between, and a saturable absorber 31 such as a sulfur hexafluoride ($SF_6$) gas cell that suppresses self-oscillation and parasitic oscillation.

Reflection surfaces 44 and 45 of the HR mirror prism 43 are coated with a coating for highly reflecting the laser beam. The discharge tube 25 is provided with a first window 46 through which the laser beam is incident and a second window 47 through which the laser beam is outputted. As the laser medium, for example, a $CO_2$ laser gas containing carbon dioxide ($CO_2$), nitrogen ($N_2$), helium (He), and additionally, according to need, hydrogen ($H_2$), carbon monoxide (CO), xenon (Xe), and so on is used.

The laser beam amplifier allows the laser beam to travel back and forth at once in the amplification region 30 to amplify the laser beam. In the double-pass amplification type laser beam amplifier, the concave HR mirror 37 having focusing ability and the HR mirror prism 43 for reflecting the incident beam and the output beam are provided to face each other with the amplification region 30 in between. Thus, by providing the concave HR mirror 37 and the HR mirror prism 43 to face each other, an incident beam position (first point) 34 and an incident beam transfer image position (second point) 35, which are conjugate to each other, can be determined.

That is, in the double-pass amplification type laser beam amplifier as shown in FIG. 5, the distance "D" between the incident beam position 34, where the incident beam is incident upon one reflection surface 44 of the HR mirror prism 43, and the concave HR mirror 37 is made substantially equal to the radius of curvature "R" (focal length f=R/2) of the concave HR mirror 37 (D≈R=2f). Thereby, the image of the incident beam in the incident beam position (first point) 34 can be transferred to the incident beam transfer image position (second point) 35 on the other reflection surface 45 of the HR mirror prism 43 in the optical path of the output beam, and a transfer image can be focused. Here, the first point 34 and the second point 35 have the relationship of the object point and the image point, and are conjugate to each other.

In FIG. 5, the seed laser beam is incident upon the reflection surface 44 of the HR mirror prism 43 at an incident angle slightly larger than 45 degrees. Then, the seed laser beam is reflected at a reflection angle slightly larger than 45 degrees, transmitted through the first window 46, amplified through the amplification region 30, further transmitted through the second window 47, and passes through the saturable absorber 31 that suppresses self-oscillation and parasitic oscillation.

The laser beam that has passed through the saturable absorber 31 is incident upon the concave HR mirror 37 at an incident angle slightly larger than 0 degree, is reflected at a reflection angle slightly larger than 0 degree, passes through the saturable absorber 31 again, is transmitted through the second window 47, and passes through the amplification region 30 for further amplification. Then, the amplified laser beam is transmitted through the first window 46 again, reaches the other reflection surface 45 of the HR mirror prism 43, is reflected at a reflection angle slightly larger than 45 degrees, and outputted as an amplified laser beam.

Here, since the incident beam position (first point) 34 and the incident beam transfer image position (second point) 35 are conjugate to each other, the image of the incident beam in the incident beam position (first point) 34 on the reflection surface 44 can be transferred to the incident beam transfer image position (second point) 35 on the reflection surface 45, and a transfer image can be focused.

The double-pass amplification may be applied to a fast-axial-flow type laser beam amplifier and a triaxial orthogonal type laser beam amplifier. The laser beam amplifier according to the second embodiment has an advantage that the laser beam amplifier can be used in an amplifier having a small amplification section (circular shape, square shape, rectangular shape having a small aspect ratio), for example, in a tubular amplifier.

Figure 6:
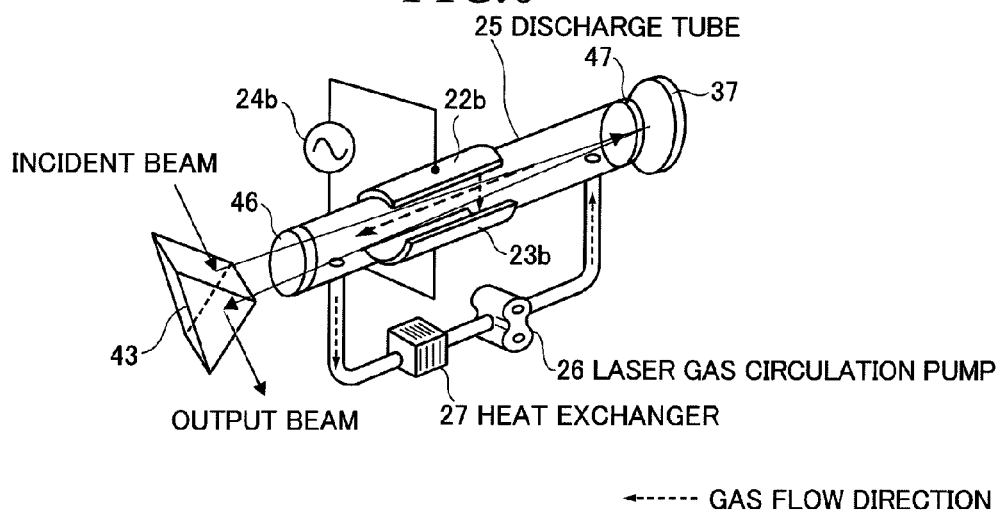
FIG. 6 is a perspective view showing a structure of a fast-axial-flow type laser beam amplifier to which the second embodiment of the present invention is applied.
Figure 7:
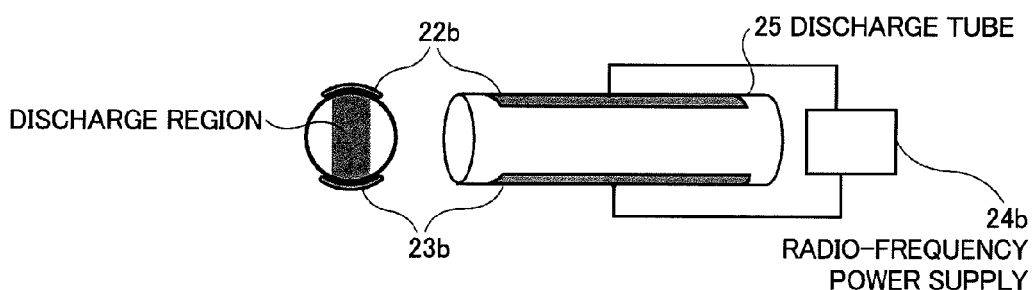
FIG. 7 shows electrodes of the fast-axial-flow type laser beam amplifier as shown in FIG. 6.

FIG. 6 is a perspective view showing a structure of a fast-axial-flow type laser beam amplifier to which the second embodiment of the present invention is applied, and FIG. 7 shows electrodes of the fast-axial-flow type laser beam amplifier as shown in FIG. 6. As shown in FIGS. 6 and 7, a pair of electrodes 22b and 23b are provided to sandwich a discharge tube 25 filled with a laser medium. When a radio-frequency (RF) power supply 24b applies a radio-frequency voltage between the electrode 22b and the electrode 23b, the electrodes 22b and 23b generate a radio-frequency electric field to perform radio-frequency discharge in the laser medium, and a discharge region is formed between the electrodes 22b and 23b.

Thereby, the laser medium is excited, and a seed laser beam (incident beam) reflected by the HR mirror prism 43 and entering the discharge tube 25 via the first window 46 is amplified. Further, the seed laser beam is transmitted through the second window 47, reflected by the concave HR mirror 37, enters the discharge tube 25 via the second window 47 again, and is amplified. The amplified laser beams is transmitted through the first window 46, incident upon the HR mirror prism 43, reflected by the HR mirror prism 43, and outputted as an output beam. The laser medium within the discharge tube 25 is circulated by a laser gas circulation pump 26, and cooled by a heat exchanger 27.

Figure 8:
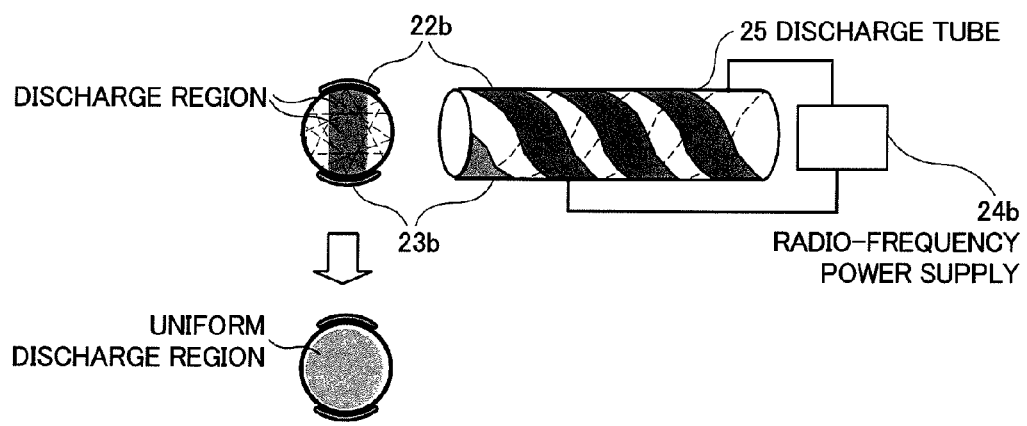
FIG. 8 shows a modified example of electrodes of the fast-axial-flow type laser beam amplifier as shown in FIG. 6.

FIG. 8 shows a modified example of the electrodes of the fast-axial-flow type laser beam amplifier as shown in FIG. 6. In FIG. 8, each of the electrodes 22b and 23b has a spiral shape. Thereby, the discharge region formed between the electrodes 22b and 23b is uniformized and uniform amplification of the laser beam can be performed.

Figure 9:
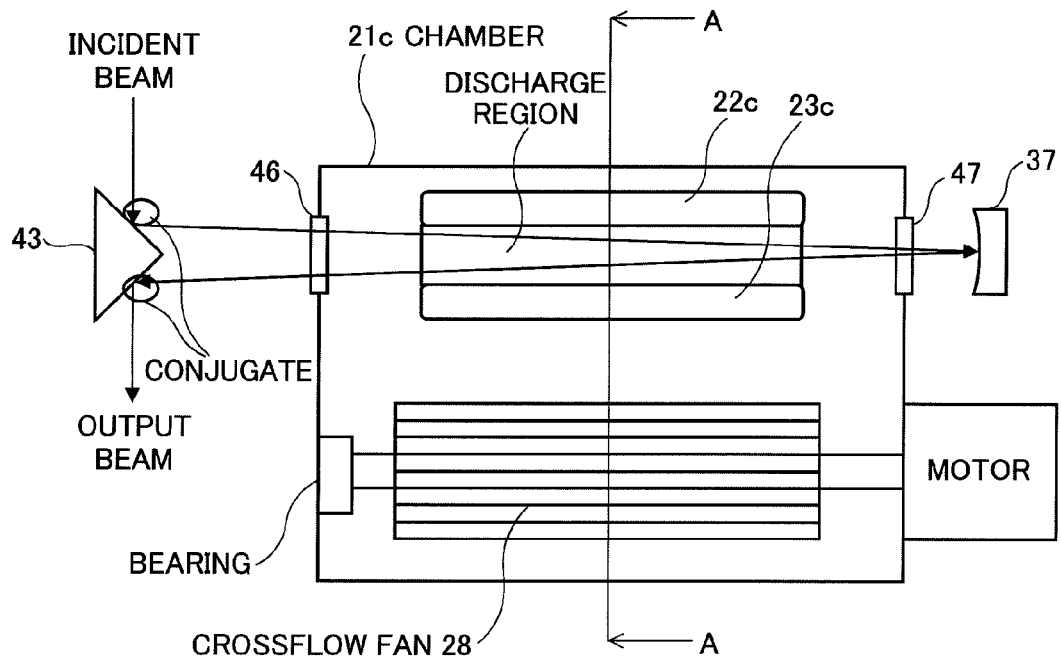
FIG. 9 is a side view showing a structure of a triaxial orthogonal type laser beam amplifier to which the second embodiment of the present invention is applied.
Figure 10:
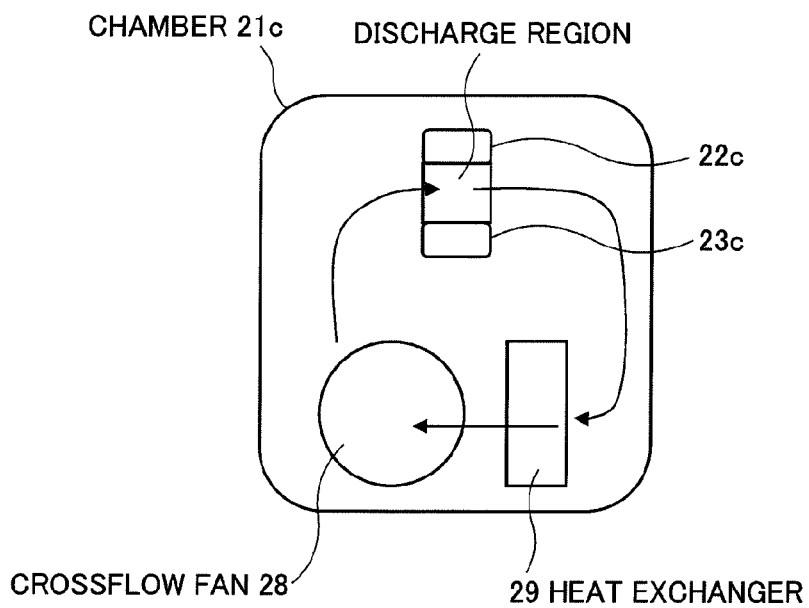
FIG. 10 is a sectional view showing A-A section of the triaxial orthogonal type laser beam amplifier as shown in FIG. 9.

FIG. 9 is a side view showing a structure of a triaxial orthogonal type laser beam amplifier to which the second embodiment of the present invention is applied, and FIG. 10 is a sectional view showing A-A section of the triaxial orthogonal type laser beam amplifier as shown in FIG. 9. As shown in FIGS. 9 and 10, a pair of electrodes 22c and 23c are provided within a chamber 21c filled with a laser medium. When a radio-frequency (RF) power supply applies a radio-frequency voltage between the electrode 22c and the electrode 23c, the electrodes 22c and 23c generate a radio-frequency electric field to perform radio-frequency discharge in the laser medium, and a discharge region is formed between the electrodes 22c and 23c.

Thereby, the laser medium is excited and a seed laser beam (incident beam) reflected by the HR mirror prism 43 and entering the chamber 21c via the first window 46 is amplified. Further, the seed laser beam is transmitted through the second window 47, reflected by the concave HR mirror 37, enters the chamber 21c via the second window 47 again, and is amplified. The amplified laser beams is transmitted through the first window 46, incident upon the HR mirror prism 43, reflected by the HR mirror prism 43, and outputted as an output beam. The laser medium within the chamber 21c is circulated by a crossflow fan 28 driven by a motor, and cooled by a heat exchanger 29.

Figure 11:
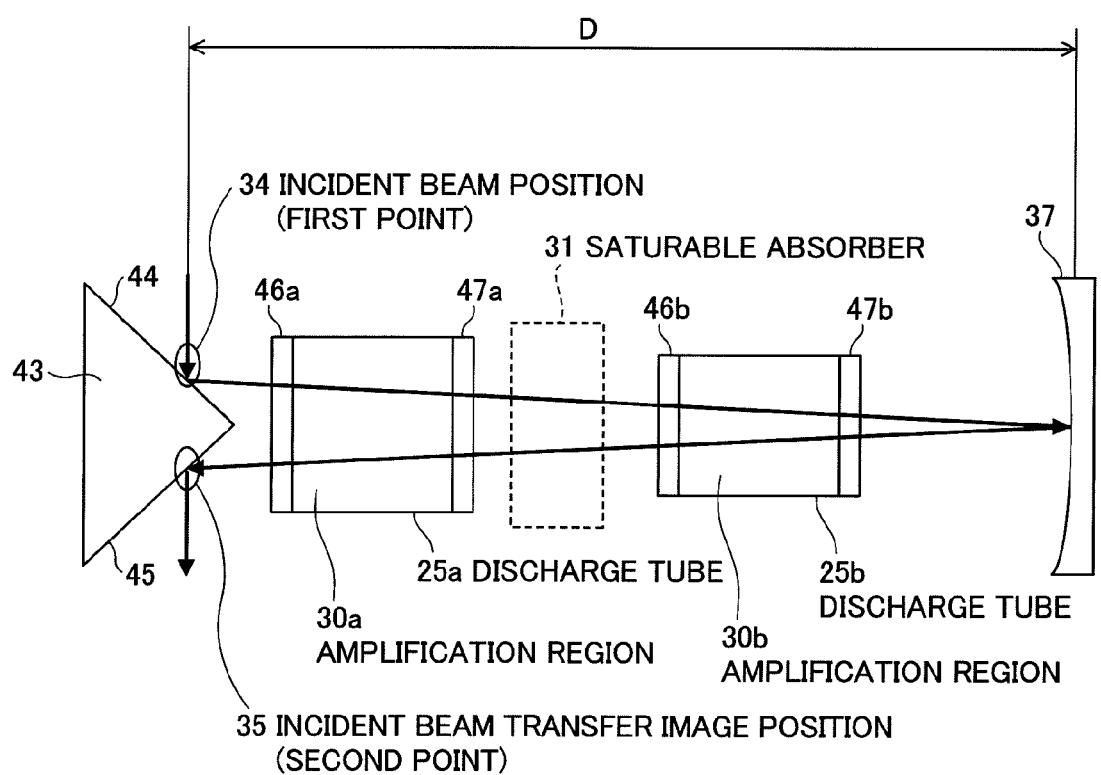
FIG. 11 shows a configuration of a laser beam amplifier according to a modified example of the second embodiment.

FIG. 11 shows a configuration of a laser beam amplifier according to a modified example of the second embodiment. The laser beam amplifier as shown in FIG. 11 is different from the laser beam amplifier as shown in FIG. 5 in that the discharge tube 25 as shown in FIG. 5 is divided into plural discharge tubes (two discharge tubes 25a and 25b are shown in FIG. 11), and thereby, the laser beam is amplified while longitudinally traversing plural amplification regions (two amplification regions 30a and 30b are shown in FIG. 11) in series. The laser beam can be efficiently amplified by setting diameters of the discharge tubes 25a and 25b according to the intervals of the laser beam passing through the discharge tubes 25a and 25b. Further, a saturable absorber 31, that suppresses self-oscillation and parasitic oscillation, may be provided between the discharge tube 25a and the discharge tube 25b.

Also in this case, the distance "D" between the incident beam position 34, where the seed laser beam (incident beam) is incident upon the HR mirror prism 43, and the concave HR mirror 37 is made substantially equal to the radius of curvature "R" of the concave HR mirror 37 (D≈R=2f). Thereby, the image of the incident beam in the incident beam position (first point) 34 can be transferred to the incident beam transfer image position (second point) 35 on the other reflection surface 45 of the HR mirror prism 43, and a transfer image can be focused. Here, the first point 34 and the second point 35 have the relationship of the object point and the image point, and are conjugate to each other.

In FIG. 11, the seed laser beam is incident upon the reflection surface 44 of the HR (high reflection) mirror prism 43 coated with a coating that reflects the seed laser beam at high reflectivity, at an incident angle slightly larger than 45 degrees. Then, the seed laser beam is reflected at a reflection angle slightly larger than 45 degrees, transmitted through a first window 46a of the discharge tube 25a, amplified through the amplification region 30a, further transmitted through a second window 47a, and passes through the saturable absorber 31 that suppresses self-oscillation and parasitic oscillation. Further, the laser beam that has passed through the saturable absorber 31 is transmitted through a first window 46b of the discharge tube 25b, amplified through the amplification region 30b, and further transmitted through a second window 47b.

The laser beam that has been transmitted through the second window 47b is incident upon the concave HR mirror 37 at an incident angle slightly larger than 0 degree, reflected at a reflection angle slightly larger than 0 degree, and amplified through the amplification region 30b again. The laser beam that has passed through the amplification region 30b passes through the saturable absorber 31 again, then, is amplified through the amplification region 30a, and reaches the other reflection surface 45 of the HR mirror prism 43, is reflected at a reflection angle slightly larger than 45 degrees, and outputted as an amplified laser beam.

Here, since the incident beam position (first point) 34 and the incident beam transfer image position (second point) 35 are conjugate to each other, the image of the incident beam in the incident beam position (first point) 34 on the reflection surface 44 can be transferred to the incident beam transfer image position (second point) 35 on the reflection surface 45, and a transfer image can be focused.

An advantage of the modified example of the second embodiment is that a discharge tube is divided into plural discharge tubes and the saturable absorber 31 can be provided between the plural discharge tubes, and therefore, the seed laser beam can be amplified with high efficiency while parasitic oscillation and self-oscillation are suppressed.

As below, several examples obtained by further embodying the embodiments of the present invention will be explained.

EXAMPLE 1

Figure 12:
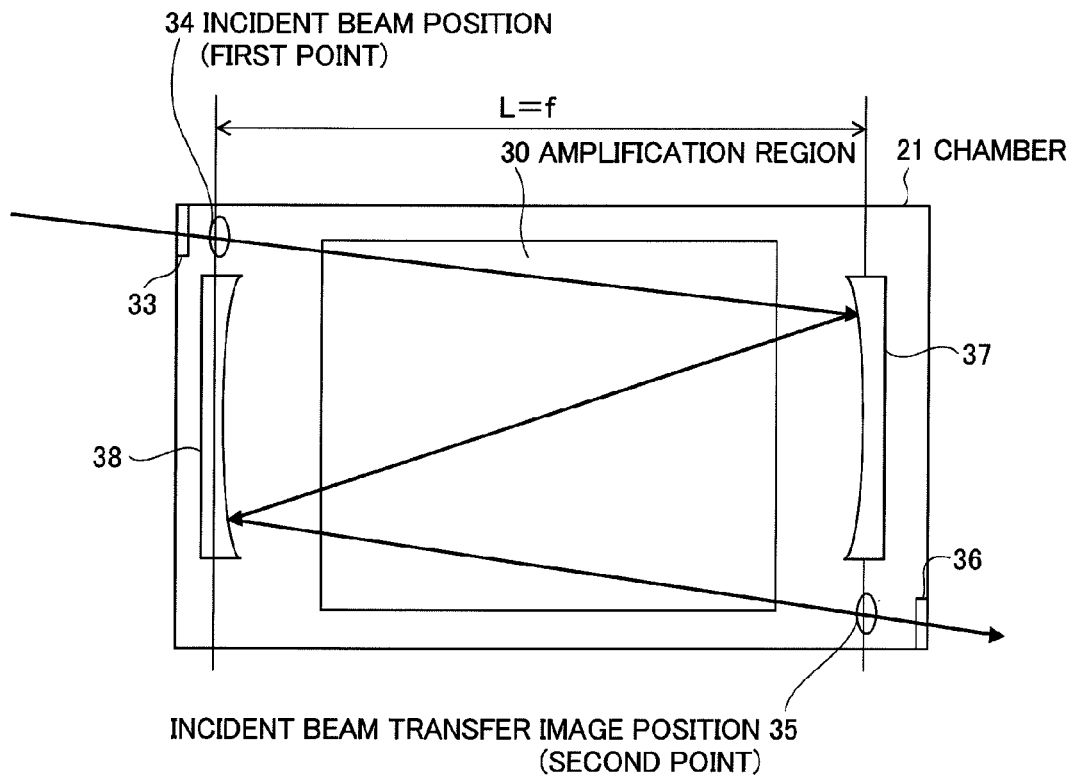
FIG. 12 is a plan sectional view of a laser beam amplifier according to a first example seen from above.

FIG. 12 is a plan sectional view of a laser beam amplifier according to a first example seen from above. In the laser beam amplifier, a radio-frequency voltage is applied between two wide plate electrodes to perform radio-frequency discharge in a $CO_2$ laser gas, and thereby, an amplification region 30 is formed. Further, both of the reflective mirrors 37 and 38 provided to sandwich the amplification region 30 are concave HR mirrors.

The seed laser beam (incident beam) is obliquely transmitted through the entrance window 33, and amplified through the amplification region 30. The seed laser beam is incident upon the reflective mirror 37 at an incident angle larger than 0 degree, reflected at high reflectivity, and amplified in the amplification region 30 again. Then, the laser beam is incident upon the reflective mirror 38 provided to face the reflective mirror 37 at an incident angle larger than 0 degree, reflected at high reflectivity, further amplified in the amplification region 30, transmitted through the exit window 36, and outputted.

Also in the optical system including the reflective mirrors 37 and 38 as shown in FIG. 12, an image of the laser beam in the incident beam position (first point) 34 set near the entrance window 33 is transferred to the incident beam transfer image position (second point) 35 set near the exit window 36 in the optical path of the output beam, and a transfer image of the incident beam is focused.

Figure 13:
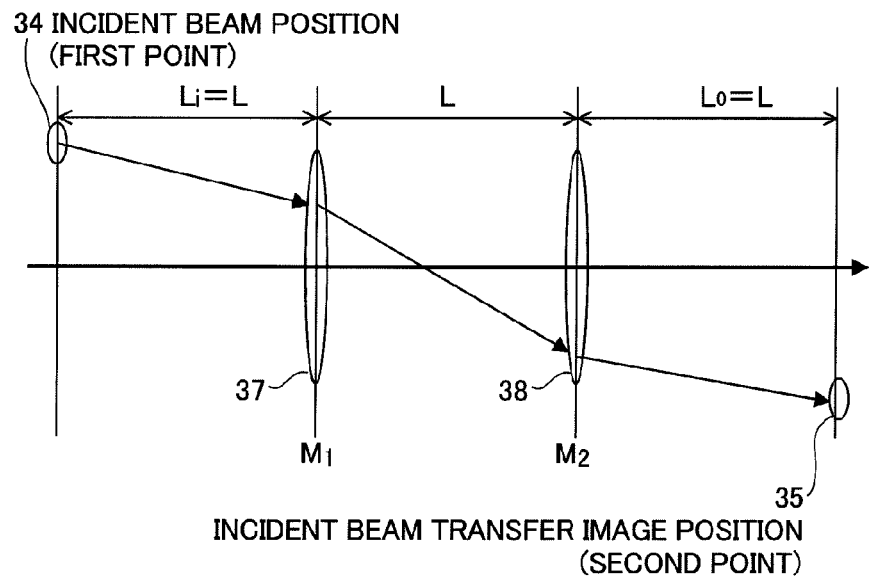
FIG. 13 is a diagram for explanation of an operation of the laser beam amplifier according to the first example with an optical system in which reflective optical elements are replaced with transmissive optical elements.

FIG. 13 is a diagram for explanation of an operation of the laser beam amplifier according to the first example with an optical system in which reflective optical elements are replaced with transmissive optical elements.

Generally, a combined focal length "F" of a complex lens system including two thin lenses M1 and M2 is expressed by the following equation (1), and a distance ZH between a principal point of the front lens M1 and a front principal point of the complex lens system is expressed by the following equation (2).

$$F = f1 \cdot f2/(f1+f2-t) \tag{1}$$

$$ZH = f1 \cdot t/(f1+f2-t) \tag{2}$$

Where f1 is a focal length of the front lens M1, f2 is a focal length of the rear lens M2, and "t" is a distance between the front lens M1 and the rear lens M2.

Assuming that the distance between the object position and the front lens M1 is equal to the distance between lenses "t", the magnification "M" of the transfer image of the object in the complex lens system is expressed by the following equation (3).

$$M = (ZH+t-F)/F \tag{3}$$

Accordingly, as shown in FIG. 13, an optical system in which the reflective mirrors 37 and 38 as shown in FIG. 12 are expressed by two thin lenses M1 and M2 having focusing ability is assumed. In FIG. 13, given that the distance "t" between the lens M1 and the lens M2 is equal to "L", the distance Li between the incident beam position (first point) 34 corresponding to the object position and the front lens M1 is made equal to "L", the distance Lo between the incident beam transfer image position (second point) 35, where the transfer image of the incident beam image in the incident beam position (first point) 34 is formed, and the rear lens M2 is made equal to "L", and the image is transferred at magnification M=1. Further, the lenses M1 and M2 have the same focal length f=R/2.

By substituting these relations into the above equations, the following equations (4) to (6) are obtained.

$$F=f^2/(2f-L) \quad (4)$$

$$ZH=f \cdot L/(2f-L) \quad (5)$$

$$M=1=(ZH+L-F)/F \quad (6)$$

From the equations (4) to (6), f=R/2=L is obtained. That is, by providing two spherical concave HR mirrors having radii of curvature R=2L to face at a distance "L" from each other, the image of the incident beam in the incident beam position (first point) 34 is transferred to the incident beam transfer image position (second point) 35 in the optical path of the output beam at a ratio of 1:1. Here, the first point 34 and the second point 35 are conjugate to each other.

The first example may be applied to the slab type $CO_2$ laser beam amplifier. Since the transfer image of the incident beam in the optical path of the output beam only varies to the equal degree to the incident beam, the laser beam amplifier according to the first example can amplify the incident beam even when the optical axis of the incident beam is shifted to some degree, and stability of the optical axis of the output beam is improved.

EXAMPLE 2

Figure 14:
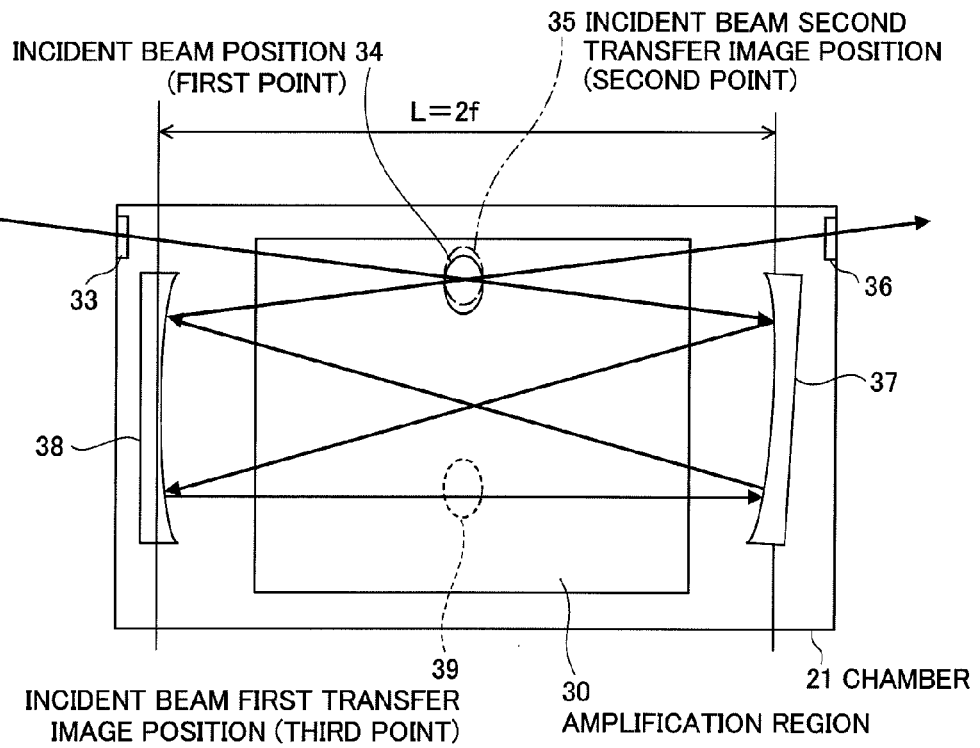
FIG. 14 is a plan sectional view of a laser beam amplifier according to a second example seen from above.

FIG. 14 is a plan sectional view of a laser beam amplifier according to a second example seen from above. The second example is applied to a slab type $CO_2$ laser beam amplifier similar to that shown in FIG. 12. The laser beam amplifier according to the second example is formed such that the laser beam is five-pass amplified by using an optical system including reflective mirrors arranged with the amplification region 30 in between. The second example is characterized in that an image of the incident beam at the first point 34 is transferred to a third point 39 in the middle of the zigzag optical path to focus a first transfer image, and the first transfer image is further transferred to the second point 35 in the optical path of the output beam to form a second transfer image. However, the second example belongs to the technical scope of the first embodiment in that the optical axis is stabilized by transferring the image of the incident beam at the first point 34 to the second point 35 in the optical path of the output laser beam.

The laser beam amplifier according to the second example transfers the image of the incident beam in the incident beam position (first point) 34 in the optical path of the incident beam to the incident beam first transfer image position (third point) 39 in the middle of the zigzag optical path to focus the first transfer image, and further, transfers the first transfer image at the third point 39 to the incident beam second transfer image position (second point) 35 in the optical path of the output beam to focus the second transfer image. Especially, the optical system of the laser beam amplifier is formed such that the incident beam position (first point) 34 substantially coincides with the incident beam second transfer image position (second point) 35. By using the optical system, it becomes easier to form the optical system of the entire laser apparatus.

In the laser beam amplifier, a pair of reflective mirrors 37 and 38 are arranged at a distance "L" to face each other with the amplification region 30 in between. Each of the reflective mirrors 37 and 38 is a concave HR mirror having a radius of curvature "R", and as shown in FIG. 14, the reflective mirror 37 is arranged at a tilt such that the lower end thereof in the drawing is close to the reflective mirror 38.

A seed laser beam (incident beam) supplied from a master oscillator is obliquely transmitted through the entrance window 33 of the laser beam amplifier, and amplified while passing through the amplification region 30 (first pass). A point at which the distance "L" between the reflective mirrors 37 and 38 in the optical path of the incident beam is equally divided into two is set to the incident beam position (first point) in the optical system. The distance Li between the first point 34 in the optical path of the incident beam and the reflective mirror 37 is L/2.

The laser beam that has been amplified by passing through the first point 34 is incident upon the reflective mirror 37 at an incident angle larger than 0 degree, reflected obliquely toward the lower left in the drawing, passes through the amplification region 30 again, and is further amplified (second pass). Further, the laser beam is incident upon the reflective mirror 38 on the left side in the drawing at an incident angle larger than 0 degree, passes through the amplification region 30 substantially horizontally in the drawing, and is amplified (third pass). Here, by adjusting the configuration of the optical system, the image of the incident beam at the first point 34 can be transferred to the third point 39 located in the middle of the reflective mirrors 37 and 38 to focus the first transfer image. Here, the first point 34 and the second point 35 have the relationship of the object point and the image point and are conjugate to each other.

Furthermore, the laser beam is reflected by the right reflective mirror 37 toward the upper left direction in the drawing and amplified through the amplification region 30 (fourth pass), reflected by the left reflective mirror 38 toward the upper right direction in the drawing and amplified through the amplification region 30 (fifth pass), and transmitted through the exit window 36 and outputted as an output beam. At that time, the optical system including the reflective mirrors 37 and 38 transfers the first transfer image at the third point 39 to the second point 35 located in the middle of the reflective mirrors 37 and 38 in the optical path of the laser beam from the reflective mirror 38 toward the exit window 36 to focus the second transfer image of the incident beam. The incident beam second transfer image position (second point) 35 may be overlapped on the incident beam position (first point) 34. The distance Lo between the reflective mirror 38 and the second point 35 in the optical path of the output beam is L/2.

Figure 15:
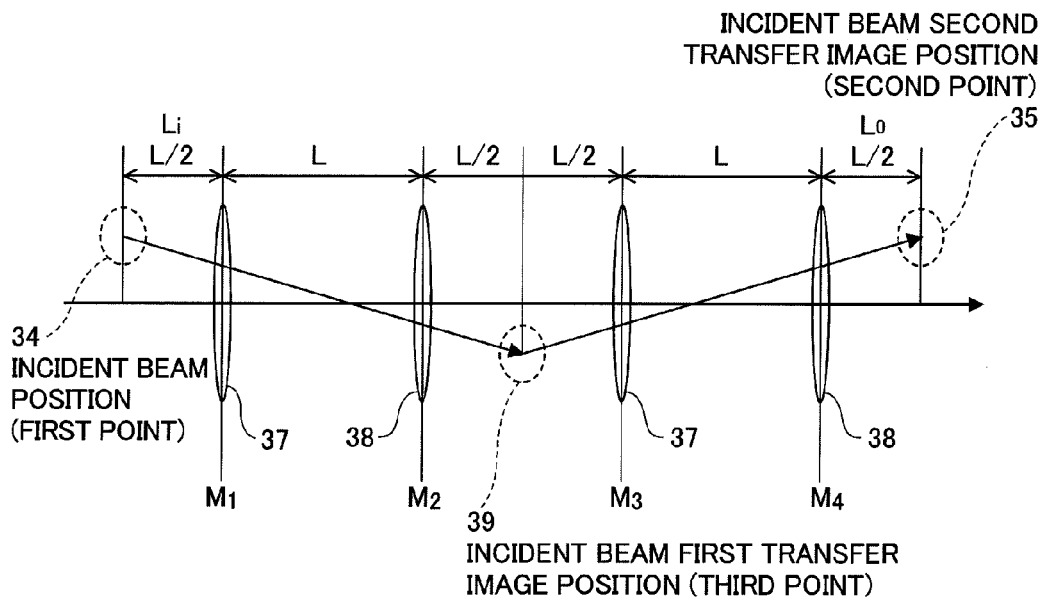
FIG. 15 is a diagram for explanation of an operation of the laser beam amplifier according to the second example with an optical system in which reflective optical elements are replaced with transmissive optical elements.

FIG. 15 is a diagram for explanation of an operation of the laser beam amplifier according to the second example with an optical system in which reflective optical elements are replaced with transmissive optical elements. This optical system is different from the optical systems shown in FIGS. 5 and 12, and it is impossible to apply the equations (1) to (3) because the combined focal length becomes infinite when substituting f1=f2=L/2 and t=L into the equation (1). Such an optical system is generally called an afocal system.

In the case where the focal lengths of the lens M1 and the lens M2 are f1 and f2, respectively, and the lenses M1 and M2 are arranged at a distance of (f1+f2) from each other, assuming that the object position is a location upstream of the lens M1 at a distance f1 from the lens M1, the transfer image position of the object is in a location downstream of the lens M2 at a distance f2 from the lens M2.

The magnification "M" in the case of the afocal system is expressed by the following equation.

$$M=f1/f2 \quad (7)$$

When f1=f2 as in the second example, the magnification "M" is "1". Here, assuming that the focal lengths of the lenses M1-M4 are the same focal length "f" and the distance between the adjacent two lenses is "L", if the relation L=2f is satisfied, the optical system as shown in FIG. 15 is obtained. Here, given that the radii of curvature of the concave mirrors 37 and 38 are "R", the optical system can be realized by satisfying the relation L=R.

Referring to FIG. 15, the seed laser beam (incident beam) is transmitted through the incident beam position (first point) 34 in the optical path of the incident beam and enters the lens M1. The incident beam position (first point) 34 is located upstream of the lens M1 at a distance L1=L/2 from the lens M1. The lens M1 has the same focusing ability as that of the right reflective mirror 37 in FIG. 14, and the lens M2 has the same focusing ability as that of the left reflective mirror 38 in FIG. 14. The distance between the lens M1 and the lens M2 is "L". The laser beam that has been transmitted through the lenses M1 and M2 focuses the first transfer image at the third point 39 located downstream of the lens M2 at a distance L/2 from the lens M2.

Further, a lens M3 is provided in a location downstream of the third point 39 at a distance L/2 from the third point 39, and further, a lens M4 is provided in a location downstream of the lens M3 at a distance "L" from the lens M3. The lens M3 has the same focusing ability as that of the right reflective mirror 37 in FIG. 14, and the lens M4 has the same focusing ability as that of the left reflective mirror 38 in FIG. 14. Thereby, the laser beam emitted from the first transfer image at the third point 39 is transmitted through the lens M3 and the lens M4, and then, forms the second transfer image at the second point 35 located at a distance of Lo=L/2 from the lens M4.

In the second example, the image of the incident beam is transferred twice. However, the present invention is not limited to the example, but the image of the incident beam may be transferred at multiple times such that the image of the incident beam at the first point in the optical path of the incident beam is transferred to the second point in the optical path of the output beam to focus the transfer image of the incident beam.

According to the second example, the transfer image of the incident beam at the second point in the optical path of the output beam only varies to the equal degree to the incident beam, and therefore, the stability of the output beam is improved. Furthermore, the amplification efficiency can be maintained high and the output of the laser beam amplifier is stabilized.

Further, in the laser beam amplifier according to the second example, the afocal optical system is employed because the first point in the optical path of the incident beam coincides with the second point in the optical path of the output beam, and therefore, the output beam is outputted with the optical grade characteristics of the incident beam (beam size, beam spread angle, and so on) maintained. As a result, in the case where the laser apparatus for amplifying the laser beam at a large amplification factor is formed by connecting many laser beam amplifiers in series, there is an advantage that alignment between optical elements to be connected becomes extremely easy.

EXAMPLE 3

Figure 16:
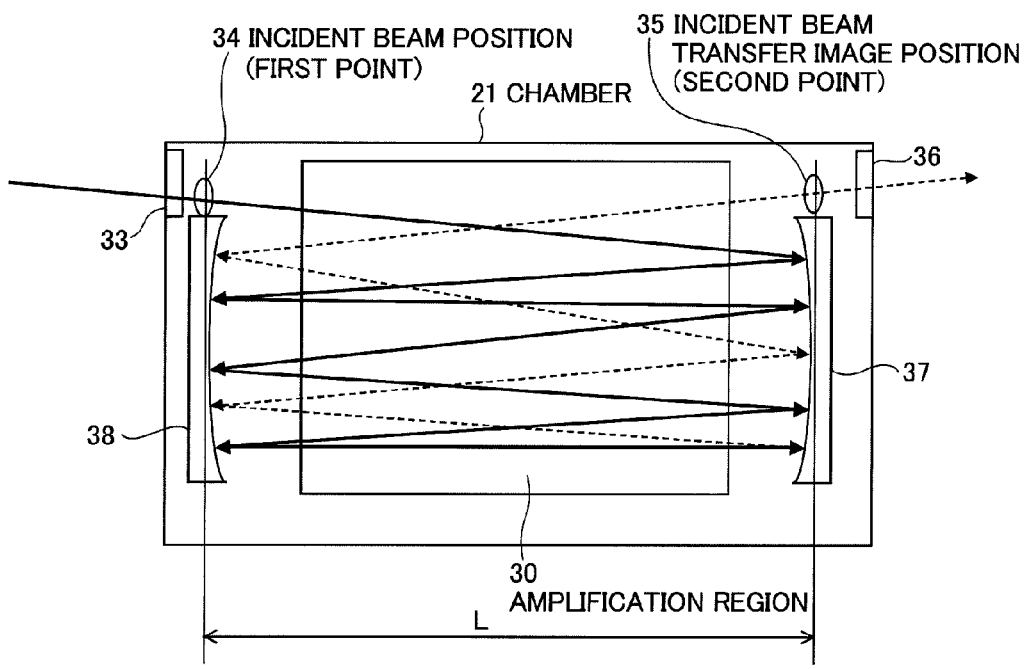
FIG. 16 is a plan sectional view of a laser beam amplifier according to a third example seen from above.

FIG. 16 is a plan sectional view of a laser beam amplifier according to a third example seen from above. In the third example, a slab type $CO_2$ laser beam amplifier similar to those shown in FIGS. 12 and 14 is assumed. The laser beam amplifier according to the third example allows the seed laser beam (incident beam) to pass through the amplification region in multiple passes in a zigzag manner by using the optical system formed by providing two reflective mirrors, each of which has a radius of curvature "R", to face each other with the amplification region 30 in between. In this manner, by the amplification in the long optical path length, the amplification efficiency can be improved, and further, the energy of the incident beam can be largely amplified and outputted. An image of the incident beam in the incident beam position (first point) 34 is transferred to the second point 35 in the optical path of the output beam, and thereby, a transfer image of the incident beam is focused.

As shown in FIG. 16, the seed laser beam (incident beam) that has obliquely entered the optical system via the entrance window 33 passes through the first point 34, and is amplified through the amplification region 30 (first pass). Then, the laser beam is incident upon the right reflective mirror 37 in the drawing at an incident angle larger than 0 degree, reflected toward the lower left, and amplified through the amplification region 30 (second pass). Further, the laser beam is incident upon the left reflective mirror 38 in the drawing at an incident angle larger than 0 degree, reflected toward the lower right, and amplified through the amplification region 30 (third pass). The process, in which the laser beam is incident upon the reflective mirror at an incident angle larger than 0 degree, reflected obliquely downward, and amplified through the amplification region 30, is repeated from the fourth pass to the sixth pass. Then, the laser beam is reflected in the substantially horizontal direction by the left reflective mirror 38 whose reflection surface in the incident position is directed upward because the reflection surface is concave, and amplified through the amplification region 30 (seventh pass).

As shown by dotted lines in FIG. 16, the process, in which the laser beam is incident upon the reflective mirror at an incident angle larger than 0 degree, reflected obliquely upward, and amplified through the amplification region 30, is repeated from the eighth pass to the eleventh pass. Then, the laser beam is transmitted through the exit window 36 and outputted as an output beam in the eleventh pass. An image of the incident beam at the first point 34 located near the entrance window 33 is transferred to the incident beam transfer image position (second point) 35 in the eleventh pass, and thereby, a transfer image of the incident beam is focused. Here, the first point 34 and the second point 35 have the relationship of the object point and the image point and are conjugate to each other.

Figure 17:
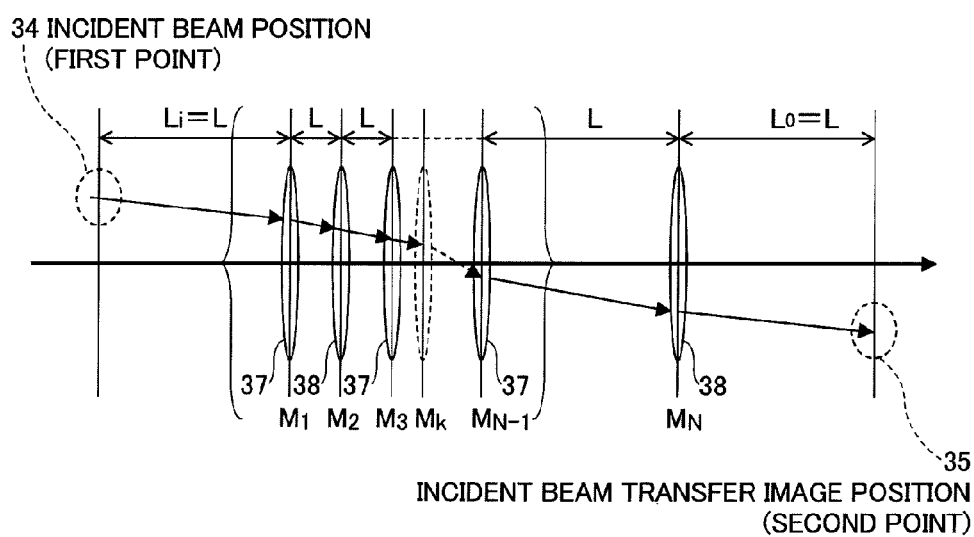
FIG. 17 is a diagram for explanation of an operation of the laser beam amplifier according to the third example with an optical system in which reflective optical elements are replaced with transmissive optical elements.

FIG. 17 is a diagram for explanation of an operation of the laser beam amplifier according to the third example with an optical system in which reflective optical elements are replaced with transmissive optical elements.

An optical system provided with two concave mirrors at both ends to perform multipass amplification is equivalent to a composite lens system in which plural lenses having the same focal length f =R/2 are arranged in series at an interval "L" such that an image of the incident beam in the position (first point 34) at a distance Li=L apart from the first lens $M_1$ to the upstream side is transferred to the position (second point 35) at a distance Lo=L apart from the last lens $M_N$ to the downstream side, and a transfer image is focused. Here, it is assumed that all (k+1) lenses ($M_1, M_2, \ldots, M_{k+1}$) have the same focal length "f". Then, the combined focal length $F_{k+1}$ of the (k+1) lenses, the distance $ZH_{k+1}$ between the front principal point of the composite lens system including the k lenses ($M_1, M_2, \ldots, M_k$) and the front principal point of the composite lens system including the (k+1) lenses ($M_1, M_2, \ldots, M_{k+1}$), and the magnification "M" of the (k+1) lenses are expressed by the following equations (8) to (10) based on the equations (1) to (3).

$$F_{k+1}=F_k \cdot f/(F_k+f-L) \tag{8}$$

$$ZH_{k+1}=F_k \cdot L/(F_k+f-L) \tag{9}$$

$$M=(ZH_{k+1}+L-F_{k+1})/F_{k+1} \tag{10}$$

In the case where k=0 (the case of only $M_1$), the initial value of the combined focal length $F_1$=f. By sequentially computing from $F_1$ to $F_N$ using the equations (8) to (10), the focal length $F_N$ and the front principal position $ZH_N$ of the composite lens system including N lenses ($M_1$, $M_2$, ..., $M_N$) can be obtained, and further the focal length "f" of each lens that makes the magnification "M" substantially equal to "1" can be obtained.

For example, assuming that the distance "L" between a pair of reflective mirrors is 1000 mm and 11-pass amplification is performed, the focal length "f" of the reflective mirrors is about 11000 mm and the radius of curvature R (=2f) is about 22000 mm based on the equations (8) to (10).

In the third example, the optical system, in which the laser beam obliquely passes through the amplification region 30 from top to bottom in a zigzag manner and then obliquely passes through the amplification region 30 from bottom to top in a zigzag manner, is employed, and therefore, the higher amplification efficiency can be realized by the multipass amplification having many passes up to 11 passes. In addition, the image of the incident beam in the incident beam position (first point) 34 is transferred to the second point 35 in the optical path of the output beam, and thereby, the stable beam trajectory can be realized.

EXAMPLE 4

Figure 18:
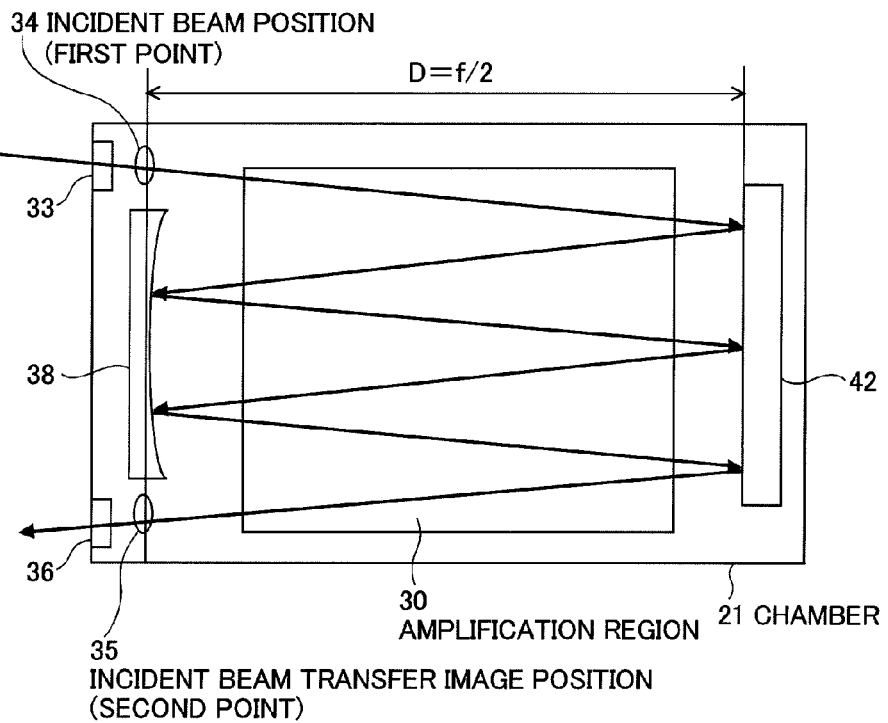
FIG. 18 is a plan sectional view of a laser beam amplifier according to a fourth example seen from above.

FIG. 18 is a plan sectional view of a laser beam amplifier according to a fourth example seen from above. In the fourth example, a slab type $CO_2$ laser beam amplifier similar to those shown in FIGS. 12, 14 and 16 is assumed. The laser beam amplifier according to the fourth example is different from the laser beam amplifier according to the third example in that 6-pass amplification is performed by using a planar HR mirror as one of the two reflective mirrors.

As shown in FIG. 18, the seed laser beam (incident beam) is obliquely transmitted through the entrance window 33, passes through the incident beam position (first point) 34, and is incident upon an optical system including two reflective mirrors 42 and 38. In the optical system, the reflective mirror 42 which is the planar HR mirror and the reflective mirror 38 which is a concave HR mirror are provided to face each other at a distance "D" substantially in parallel.

The seed laser beam (incident beam) that has entered the laser beam amplifier is amplified through the amplification region 30 (first pass), incident upon the reflective mirror 42 at an incident angle larger than 0 degree, reflected obliquely downward, amplified through the amplification region 30 (second pass), incident upon the reflective mirror 38 at an incident angle larger than 0 degree, reflected obliquely downward, and amplified through the amplification region 30 (third pass).

Further, the laser beam is incident upon the reflective mirror 42 at an incident angle larger than 0 degree, reflected obliquely downward, amplified through the amplification region 30 (fourth pass), incident upon the reflective mirror 38 at an incident angle larger than 0 degree, reflected obliquely downward, amplified through the amplification region 30 (fifth pass), reflected obliquely downward by the reflective mirror 42, amplified through the amplification region 30 (sixth pass), and passes through the incident beam transfer image position (second point) 35 and is outputted as an output beam via the exit window 36.

In the fourth example, the reflective mirror 38 and the reflective mirror 42 are provided to face to each other in parallel with the distance "D". Further, the position in which the beam passes a side of the reflective mirror 38 in the optical path of the incident beam is set to the incident beam position (first point) 34, and the position in which the beam passes the opposite side of the reflective mirror 38 in the optical path of the output beam is set to the incident beam transfer image position (second point) 35. Furthermore, the optical system is adapted such that an image of the incident beam at the first point 34 is transferred to the second point 35 to focus a transfer image. Here, the first point 34 and the second point 35 have the relationship of the object point and the image point and are conjugate to each other.

Figure 19:
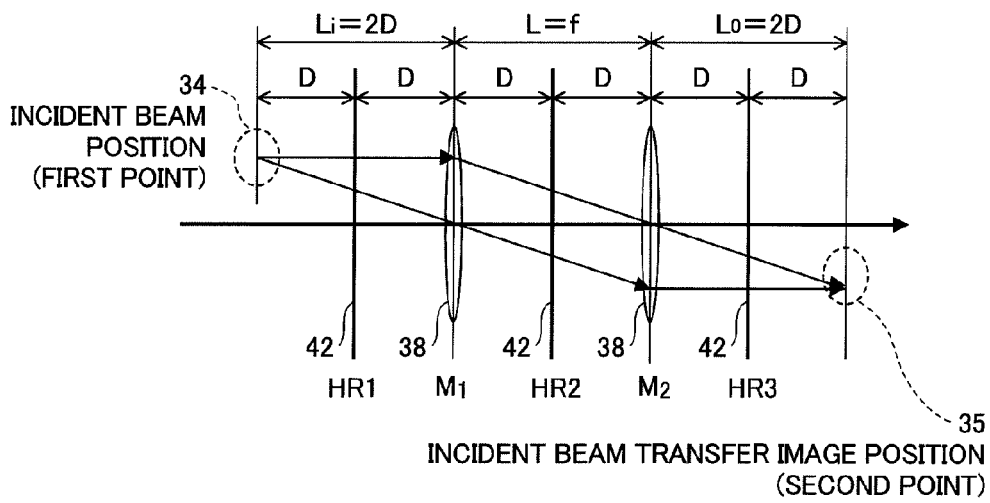
FIG. 19 is a diagram for explanation of an operation of the laser beam amplifier according to the fourth example with an optical system in which reflective optical elements are replaced with transmissive optical elements and the transmissive optical elements are disposed in series.

FIG. 19 is a diagram for explanation of an operation of the laser beam amplifier according to the fourth example with an optical system in which reflective optical elements are replaced with transmissive optical elements and the transmissive optical elements are disposed in series. In FIG. 19, planar transparent plates HR1, HR2 and HR3 representing the reflective mirror 42 have no focusing ability, and therefore, the optical system has substantially the same configuration as that shown in FIG. 13. Here, there are positional relationships that the distance "L" between two lenses M1 and M2 corresponding to the reflective mirror 38 having focusing ability is 2D, the first point 34 is at the upstream side of the lens M1 with a distance of Li=2D from the lens M1, and the transfer image of the image of the laser beam at the first point 34 is focused at the second point 35 at the downstream side of the lens M2 with a distance of Lo=2D from the lens M2.

The combined focal length "F", the distance between principal points ZH, and the magnification "M" of the lenses M1 and M2 can be obtained by using the following equations (11) to (13) obtained by replacing "L" with 2D in the equations (4) to (6).

$$F=f^2/(2f-2D) \tag{11}$$

$$ZH=f \cdot 2D/(2f-2D) \tag{12}$$

$$M=1=(ZH+2D-F)/F \tag{13}$$

Here, regarding the focal length "f" of the reflective mirror 38, from the equations (11) to (13), D=f/2 (L=f) holds for satisfaction of the magnification M=1. Given that the radius of curvature of the reflective mirror 38 is "R", the radius of curvature satisfies R=2f=4D.

The laser beam amplifier according to the fourth example can stably amplify the laser beam because the position and the angle of the output beam only vary to the equal degree to the position and the angle of the incident beam even when the optical axis of the incident beam relative to the laser beam amplifier is shifted to some degree and the amplification efficiency hardly varies. Further, the stability of the optical axis is improved, and alignment in combination with another optical device is easy. Furthermore, one of features of the laser beam amplifier according to the fourth example is that the incident beam and the output beam pass the both sides of the reflective mirror 38, and the laser beam can enter and be outputted at one side surface of the laser beam amplifier.

EXAMPLE 5

Figure 20:
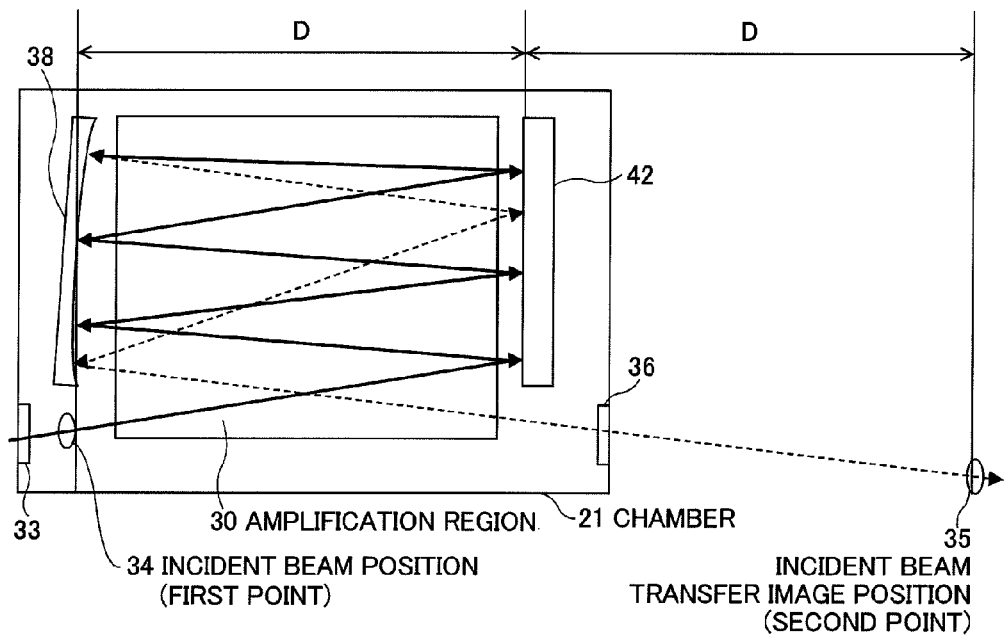
FIG. 20 is a plan sectional view of a laser beam amplifier according to a fifth example seen from above.

FIG. 20 is a plan sectional view of a laser beam amplifier according to a fifth example seen from above. In the example, a slab type $CO_2$ laser beam amplifier similar to those shown in FIGS. 12, 14, 16 and 18 is assumed. The laser beam amplifier according to the fifth example is different from the laser beam amplifier according to the fourth example in that, instead of providing the two reflective mirrors to face each other in parallel, the two reflective mirrors are provided such that the principal surfaces of them form a slight angle to increase the number of passes, and that the incident beam transfer image position (second point) 35 is defined in the optical path of the output beam outside of the chamber of the laser beam amplifier.

The seed laser beam (incident beam) that has transmitted obliquely upward through the entrance window 33 provided in the lower left part of the chamber 21 in FIG. 20 passes through the first point 34, and then, enters the optical system including the reflective mirror 42 and the reflective mirror 38 provided to face each other at the distance "D". The distance "L" in the optical path from the reflection point of the laser beam on the reflective mirror 38 having focusing ability to the next incident point of the laser beam upon the reflective mirror 38 is 2D.

The reflective mirror 42 and the reflective mirror 38 face each other not in parallel but at a slight angle. In FIG. 20, the reflective mirror 38 is provided at a tilt such that the upper end in the drawing is close to the reflective mirror 42. The reflective mirror 42 and the reflective mirror 38 are provided at a slight tilt relative to each other, and thereby, multipass amplification with many passes can be realized.

Further, the position in which the beam passes a side of the reflective mirror 38 in the optical path of the incident beam is set to the incident beam position (first point) 34, and the position in the optical path of the output beam at the downstream with the distance of 2D from the position, in which the output beam is last reflected by the reflective mirror 38, is set to the incident beam transfer image position (second point) 35, and the optical system is adapted such that a transfer image of the incident beam at the first point 34 is focused on the second point 35. The second point 35 is in the optical path of the output beam outputted via the exit window 36.

Referring to FIG. 20, the seed laser beam (incident beam) entering the laser beam amplifier is transmitted obliquely from below through the entrance window 33, passes through the first point 34, and enters the optical system. The seed laser beam is amplified through the amplification region 30 (first pass), incident upon the reflective mirror 42 at an incident angle larger than 0 degree, reflected obliquely upward, amplified through the amplification region 30 (second pass), incident upon the reflective mirror 38 at an incident angle larger than 0 degree, reflected obliquely upward, and amplified through the amplification region 30 (third pass).

Furthermore, the amplified laser beam is reflected obliquely upward by the reflective mirror 42, amplified through the amplification region 30 (fourth pass), incident upon the reflective mirror 38 at an incident angle larger than 0 degree, reflected obliquely upward, amplified through the amplification region 30 (fifth pass), incident upon the reflective mirror 42 at an incident angle larger than 0 degree, reflected obliquely upward, amplified through the amplification region 30 (sixth pass), and incident upon the reflective mirror 38. The reflection surface of the reflective mirror 38 is a concave surface and the principal surface is slightly tilted downward relative to the reflective mirror 42, and the reflection surface is tilted downward. Accordingly, the laser beam incident upon the reflective mirror 38 is reflected obliquely downward as shown by the dotted line in FIG. 20.

The laser beam reflected obliquely downward is amplified through the amplification region 30 (seventh pass), incident upon the reflective mirror 42 at an incident angle larger than 0 degree, reflected obliquely downward, amplified through the amplification region 30 (eighth pass), incident upon the reflective mirror 38 at an incident angle larger than 0 degree, reflected obliquely downward, and amplified through the amplification region 30 (ninth pass). The amplified laser beam is transmitted through the exit window 36 and outputted as an output beam. In the optical path of the output beam, the incident beam transfer image position (second point) 35, to which the image of the incident beam at the first point 34 is transferred, is defined in the position at the downstream with the distance 2D from the reflective mirror 38. Here, the first point 34 and the second point 35 have the relationship of the object point and the image point and are conjugate to each other.

Figure 21:
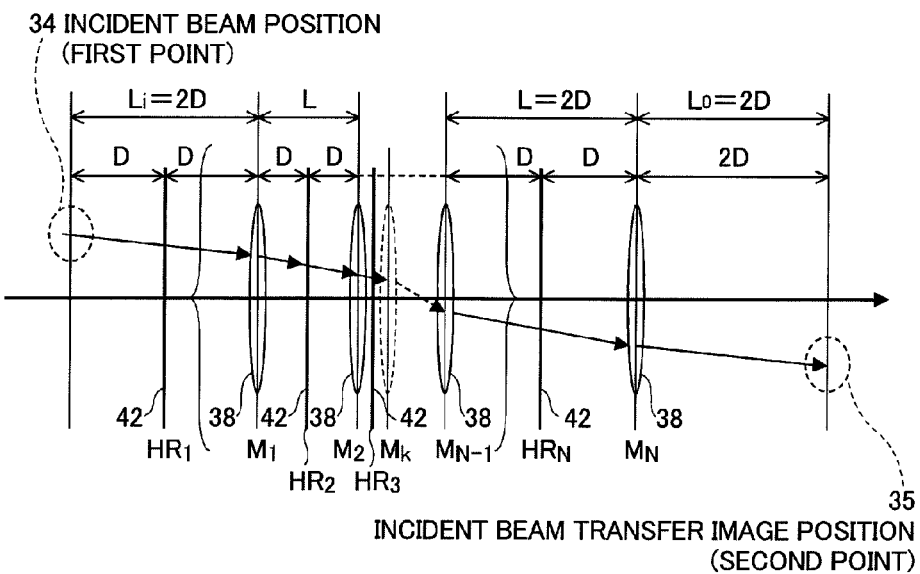
FIG. 21 is a diagram for explanation of an operation of the laser beam amplifier according to the fifth example with an optical system in which reflective optical elements are replaced with transmissive optical elements and the transmissive optical elements are disposed in series.

FIG. 21 is a diagram for explanation of an operation of the laser beam amplifier according to the fifth example with an optical system in which reflective optical elements are replaced with transmissive optical elements and the transmissive optical elements are disposed in series. By setting a distance "D" between the incident beam position (first point) 34 and the reflective mirror 42 (planar transparent plate $HR_1$), the distance Li between the incident beam position (first point) 34 and the first lens $M_1$ is represented by 2D, and the distance Lo between the last lens $M_N$ and the incident beam transfer image position (second point) 35 is represented by 2D.

In the case where the distance "D" between the reflective mirror 38 and the reflective mirror 42 is used, the combined focal length $F_k$, the distance between principal points $ZH_k$, and the magnification "M" of k mirrors (lenses) can be obtained by the following equations (14) to (16) obtained by replacing "L" with 2D in the equations (8) to (10).

$$F_{k+1}=F_k \cdot f/(F_k+f-2D) \quad (14)$$

$$ZH_{k+1}=F_k \cdot 2D/(F_k+f-2D) \quad (15)$$

$$M=(ZH_{k+1}+2D-F_{k+1})/F_{k+1} \quad (16)$$

If k=0, the initial value of the combined focal length $F_1=f$. By sequentially computing from $F_1$ to $F_N$ by using the equations (14) to (16), the combined focal length $F_N$ and the front principal position $ZH_N$ of the N lenses ($M_1, M_2, \ldots, M_N$) can be obtained, and further, the focal length "f" of each lens having the magnification "M" that satisfies substantially "1" can be obtained. For example, when D=600 mm and 9-pass amplification is performed, the radius of curvature "R" is about 7200 mm.

An advantage of the fifth example is that many passes are provided through the amplification region and the energy of the laser medium is utilized more efficiently, and thereby, a high-output laser beam is obtained and the optical axis of the laser beam amplifier becomes stable.

EXAMPLE 6

Figure 22:
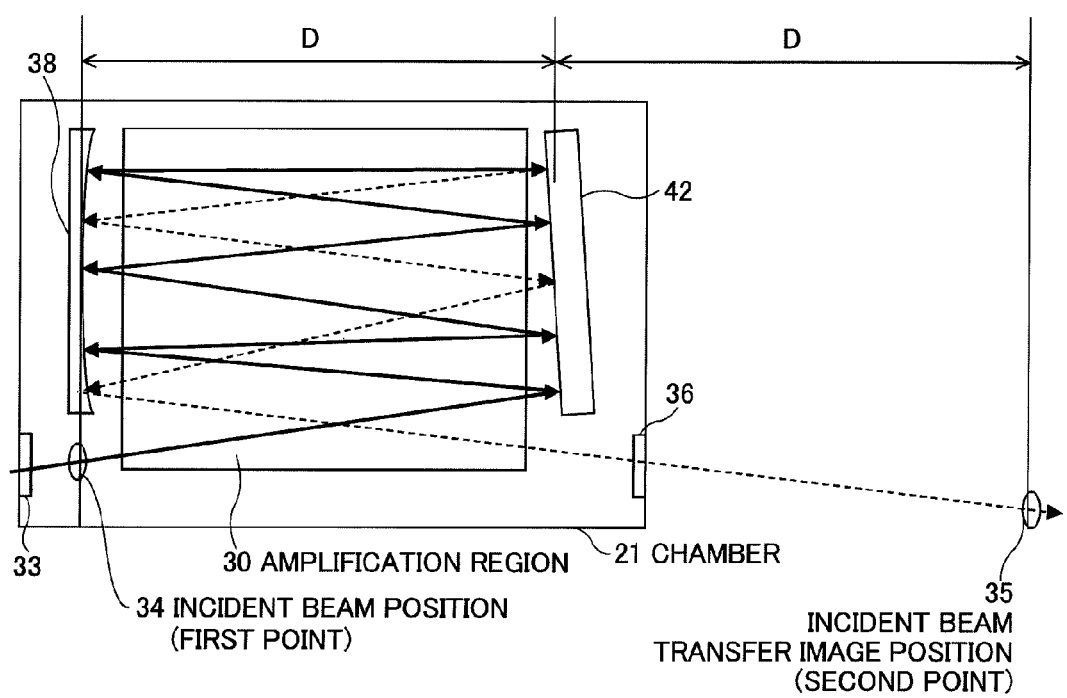
FIG. 22 is a plan sectional view of a laser beam amplifier according to a sixth example seen from above.

FIG. 22 is a plan sectional view of a laser beam amplifier according to a sixth example seen from above. The optical system of the laser beam amplifier according to the sixth example is substantially the same as that shown in FIG. 21, and will be omitted here. The laser beam amplifier according to the sixth example has substantially the same configuration as that of the slab type laser beam amplifier according to the fifth example shown in FIG. 20, and a multipass amplification type laser beam amplifier in which one reflective mirror 38 is provided substantially orthogonal to the longitudinal direction of the laser beam amplifier and the other reflective mirror

42 is provided at a predetermined angle to face the reflective mirror 38. In this type of laser beam amplifier, the number of passes can be appropriately changed by adjusting the focusing ability and the length of each reflective mirror, the angle between the two reflective mirrors, the incident angle of the seed laser beam, and so on. In the sixth example as shown in FIG. 22, the number of passes is set to 11.

In the laser beam amplifier, the seed laser beam supplied to the laser beam amplifier enters the optical system including the reflective mirror 42 and the reflective mirror 38 provided to face each other at a distance "D". The reflective mirror 38 is provided to be orthogonal to the longitudinal direction of the amplifier and the reflective mirror 42 is provided at a tilt such that the upper end in the drawing is close to the reflective mirror 38.

The seed laser beam (incident beam) that has entered the laser beam amplifier is transmitted from the lower left through the entrance window 33, passes through the first point 34, and enters the optical system. The seed laser beam is amplified through the amplification region 30 (first pass), incident upon the reflective mirror 42 at an incident angle larger than 0 degree, reflected obliquely upward, amplified through the amplification region 30 (second pass), incident upon the reflective mirror 38 at an incident angle larger than 0 degree, reflected obliquely upward, and amplified through the amplification region 30 (third pass).

Further, the laser beam is incident upon the reflective mirror 42, reflected obliquely upward, amplified through the amplification region 30 (fourth pass), incident upon the reflective mirror 38, reflected obliquely upward, amplified through the amplification region 30 (fifth pass), incident upon the reflective mirror 42, reflected obliquely upward, amplified through the amplification region 30 (sixth pass), incident upon the reflective mirror 38, and is reflected. The laser beam that has reflected by the reflective mirror 38 is amplified through the amplification region 30 (seventh pass), and incident upon the reflective mirror 42. The reflective mirror 38 and the reflective mirror 42 are tilted relative to each other, and thereby, the incident angle of the laser beam incident upon the reflective mirror 42 gradually decreases. Accordingly, the laser beam incident upon the reflective mirror 42 is reflected obliquely downward as shown by the dotted line in FIG. 22.

The laser beam that has been reflected obliquely downward by the reflective mirror 42 is amplified through the amplification region 30 (eighth pass), incident upon the reflective mirror 38, reflected obliquely downward, and amplified through the amplification region 30 (ninth pass). Further, the laser beam is incident upon the reflective mirror 42, reflected obliquely downward, amplified through the amplification region 30 (tenth pass), incident upon the reflective mirror 38, reflected obliquely downward, amplified through the amplification region 30 (eleventh pass), and transmitted through the exit window 36 and outputted as an output beam.

In the optical path of the output beam, the incident beam transfer image position (second point) 35, to which an image of the incident beam at the incident beam position (first point) 34 is transferred to focus a transfer image, is defined in the position at the downstream with the distance 2D=L from the reflective mirror 38 by which the output beam is last reflected. By the action of the optical system, the image of the laser beam at the first point 34 is transferred to the second point 35, and the transfer image is focused. Here, the first point 34 and the second point 35 have the relationship of the object point and the image point and are conjugate to each other.

The combined focal length $F_N$, the front principal position $ZH_N$, and the magnification "M" of the optical system can be obtained from the equations (14) to (16). For example, when D=1800 mm and 11-pass amplification is performed, the radius of curvature "R" is about 30000 mm.

An advantage of the sixth example is the same as that in the fifth example, and further, another advantage is that the adjustment of the optical path can be performed by the adjustment of the reflective mirror 42 that is easy to be adjusted while fixing the reflective mirror 38 for which the location and position are hard to adjust, and the design and the alignment of the laser beam amplifier may be easier.

In the above-mentioned examples, as the optical system for multipass amplification of the laser beam in the amplification region, the combination of two concave mirrors or the combination of the planar mirror and the concave mirror is used. However, the present invention is not limited to these examples, and any optical system including an optical element having focusing ability may be used. For example, a combination of a concave mirror and a convex mirror or a combination of a convex lens and planar mirrors may be used.

(Laser Apparatus)

Next, a laser apparatus according to several embodiments of the present invention will be explained. The laser apparatus according to the embodiments of the present invention is used as a driver laser apparatus for irradiating a target material with a laser beam to turn the target material into plasma in an LPP type EUV light source apparatus. The driver laser apparatus employs the laser beam amplifier according to the first or second embodiment of the present invention, and can efficiently amplify a seed laser beam at a high amplification factor and focus the amplified laser beam to a plasma emission point to generate EUV light with high efficiency.

(Embodiment 3)

Figure 23:
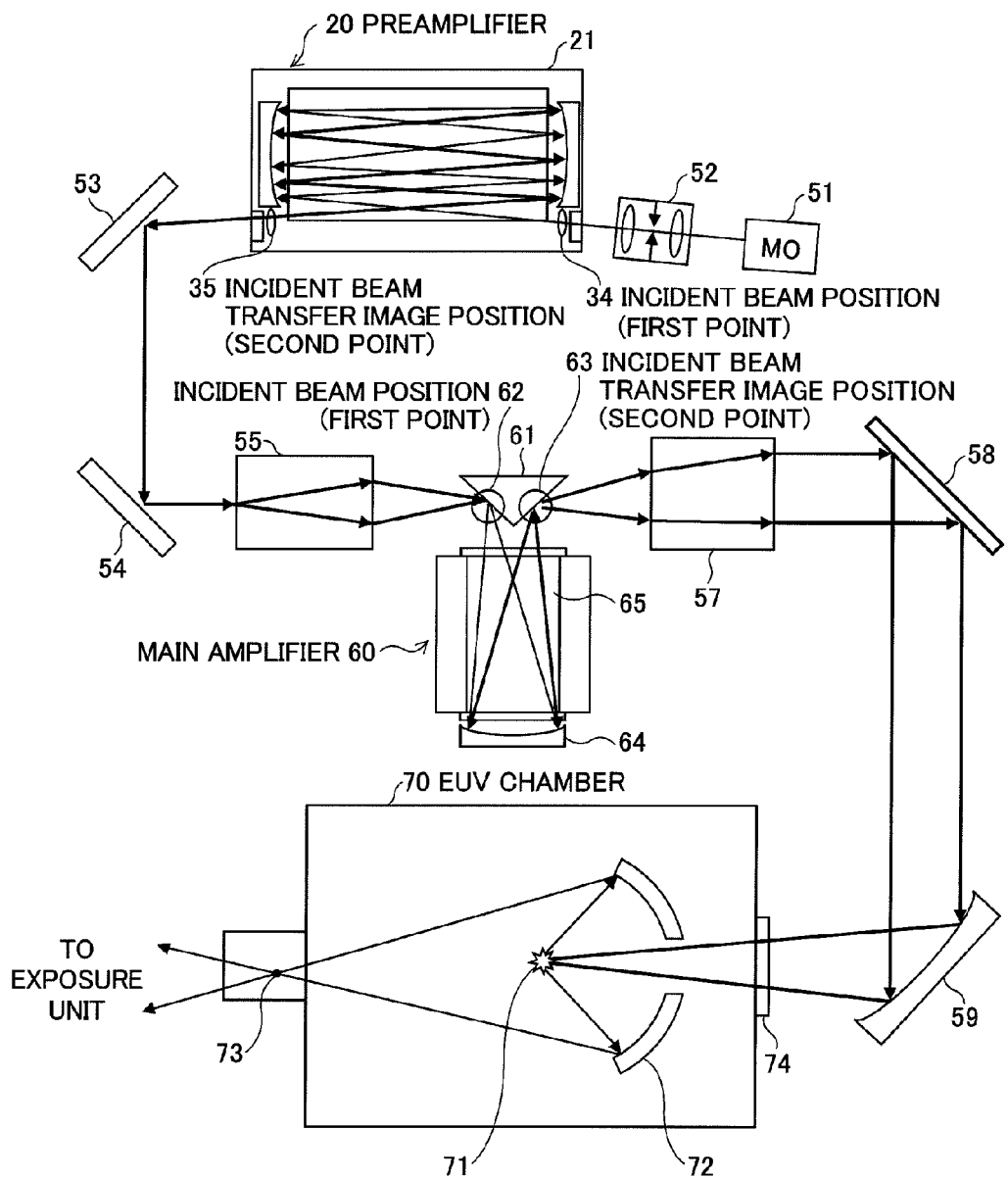
FIG. 23 shows a configuration of an EUV light source apparatus using a driver laser apparatus according to the third embodiment of the present invention.

FIG. 23 shows a configuration of an EUV light source apparatus using a driver laser apparatus according to the third embodiment of the present invention. The driver laser apparatus according to the third embodiment employs a slab type laser beam amplifier for a preamplifier and a fast-axial-flow type laser beam amplifier for a main amplifier, and supplies a driver laser beam for the EUV light source apparatus.

The driver laser apparatus according to the third embodiment includes a master oscillator (MO) 51 for generating a seed laser beam, a spatial filter 52 for spatially filtering a spatial lateral mode of the seed laser beam, a preamplifier 20, HR (high reflectivity) mirrors 53, 54 and 58, relay optics 55 and 57, and a main amplifier 60. The driver laser apparatus amplifies the seed laser beam to necessary light intensity and outputs the amplified laser beam to an off-axis parabolic mirror 59. The off-axis parabolic mirror 59 focuses the amplified laser beam on a target within an EUV chamber 70. Here, the focusing point of the amplified laser beam coincides with a plasma emission point 71.

The master oscillator 51 outputs as the seed laser beam, for example, a carbon dioxide ($CO_2$) pulse laser beam of a low-order spatial lateral mode at a repetition rate of 100 kHz with a pulse duration of about 20 ns. When the seed laser beam passes through the spatial filter 52, the seed laser beam, in which the high-order mode of the spatial lateral mode is cut and the spatial lateral mode becomes a single mode, enters the entrance window of the preamplifier 20.

The preamplifier 20 includes the slab type laser beam amplifier according to the first embodiment. As already explained in detail in the first embodiment, the seed laser beam enters the slab type laser beam amplifier, is efficiently multipass-amplified by multiple reflection between the two reflective mirrors provided to face each other with the amplification region in between, and outputted as an amplified laser beam. The preamplifier 20 focuses the transfer image of the incident beam at the incident beam position (first point) 34 on the optical path of the incident beam to the second point 35 in the optical path of the output beam. Therefore, even when there is some error of the optical path of the incident beam relative to the reference optical path, the error of the optical path of the output beam relative to the reference optical path becomes substantially equal to the error of the optical path of the incident beam relative to the reference optical path, and the optical axis of the laser beam is extremely stable.

The optical path of the laser beam outputted from the preamplifier 20 is changed by the HR mirrors 53 and 54, and the laser beam enters the relay optics 55. The relay optics 55 adjusts the size and the spread angle of the laser beam such that the laser beam efficiently passes through the amplification region of the main amplifier 60, and makes the laser beam incident upon a first reflection surface of a right angle prism 61 in the main amplifier 60 at an incident angle slightly larger than 45 degrees.

The main amplifier 60 includes the fast-axial-flow type laser beam amplifier according to the second embodiment. The reflection surfaces of the right angle prism 61 are high-reflection surfaces. The laser beam amplified by the preamplifier 20 is reflected by the first reflection surface of the right angle prism 61, and the reflected laser beam enters an amplification region 65 as a seed laser beam. The seed laser beam is amplified through the amplification region 65, is incident upon the concave HR mirror 64 at an incident angle slightly larger than 0 degree and is reflected, enters the amplification region 65 again and is amplified, is incident upon the second reflection surface of the right angle prism 61 at an incident angle slightly larger than 45 degrees and is reflected, and is outputted from the main amplifier 60.

In the main amplifier 60, an incident beam position (first point) 62 is defined on the first reflection surface of the right angle prism 61, and an incident beam transfer image position (second point) 63 is defined on the second reflection surface of the right angle prism 61. The optical system of the main amplifier 60 is adapted to transfer an image of the seed laser beam at the first point 62 to the second point 63 to focus a transfer image. Therefore, the optical axis variation of the incident beam in the main amplifier 60 is transferred to the optical axis variation of the output beam without being amplified, and the optical axis variation of the laser beam can be sufficiently suppressed. Furthermore, by performing double-pass amplification, the amplification efficiency of the laser beam in the preamplifier 20 can be improved.

The laser beam amplified by the main amplifier 60 enters the relay optics 57. The relay optics 57 adjusts the size of the laser beam such that the laser beam can be focused by the off-axis parabolic mirror 59, and converts the wavefront of the laser beam into plane wave. The laser beam that has passed through the relay optics 57 is reflected by the HR mirror 58 at high reflectivity, and incident upon the off-axis parabolic mirror 59. The laser beam reflected by the off-axis parabolic mirror 59 is introduced into the EUV chamber 70 via a window 74, and focused on the target at the plasma emission point 71 to generate plasma. An EUV collector mirror 72 having a reflection surface of a spheroidal shape collects the EUV light radiated from the generated plasma to an intermediate focusing point (IF) 73. The EUV light collected at the intermediate focusing point 73 is supplied to an exposure unit.

According to the third embodiment, although the optical path length within the driver laser apparatus is very long, the optical axes in the preamplifier 20 and the main amplifier 60 are stable, and thereby, alignment adjustment of the entire driver laser apparatus is easy and the optical axis of the output laser beam is extremely stable. As a result, the position and shape of the focusing point of the laser beam is stable and the energy stability of EUV light is improved.

In the third embodiment, the fast-axial-flow type laser beam amplifier having a tubular shape is used in the main amplifier 60. However, the present invention is not limited to that, but a fast-axial-flow type laser beam amplifier having an elliptical, oval, rectangular, or the like shape, a triaxial orthogonal type laser beam amplifier, or a slab type laser beam amplifier may be used. Further, a fast-axial-flow type laser beam amplifier or the like may be used in the preamplifier 20.

(Embodiment 4)

Figure 24:
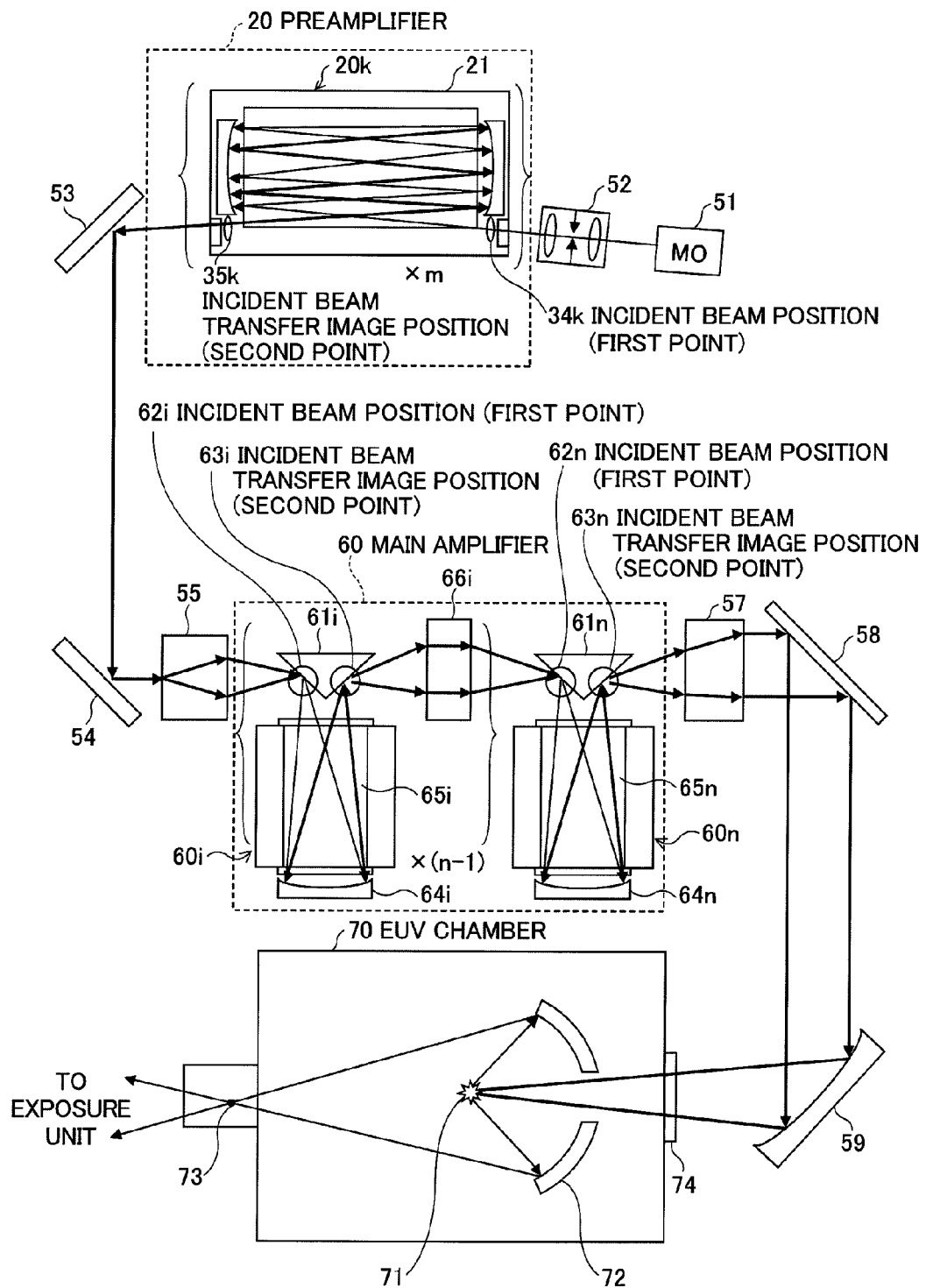
FIG. 24 shows a configuration of an EUV light source apparatus using a driver laser apparatus according to the fourth embodiment of the present invention.

FIG. 24 shows a configuration of an EUV light source apparatus using a driver laser apparatus according to the fourth embodiment of the present invention. As shown in FIG. 24, the driver laser apparatus according to the fourth embodiment includes a master oscillator 51 for generating a seed laser beam, a spatial filter 52 for spatially filtering a spatial lateral mode of the seed laser beam, a preamplifier 20 including multiple stages of m laser beam amplifiers, HR mirrors 53, 54 and 58, relay optics 55 and 57, and a main amplifier 60 including multiple stages of n laser beam amplifiers. Here, "m" and "n" are natural numbers equal to or more than 2. The driver laser apparatus amplifies the seed laser beam to necessary light intensity and outputs the amplified laser beam to an off-axis parabolic mirror 59. The off-axis parabolic mirror 59 focuses the amplified laser beam on a target. The focusing point of the amplified laser beam coincides with a plasma emission point 71 within an EUV chamber 70.

The driver laser apparatus according to the fourth embodiment differs from the driver laser apparatus according to the third embodiment as shown in FIG. 23 in that the preamplifier 20 includes multiple stages of slab type laser beam amplifiers and the main amplifier 60 includes multiple stages of fast-axial-flow type laser beam amplifiers. There is no difference in the other elements, and the multiple stages of the laser beam amplifier will be explained as below.

The preamplifier 20 in the driver laser apparatus according to the fourth embodiment includes m stages of slab type laser beam amplifiers according to the first embodiment connected in series. In each slab type laser beam amplifier 20$k$, the optical system is adapted such that a transfer image of the image of the incident beam at the first point 34$k$ located near the entrance window is focused onto the second point 35$k$ located near the exit window. Accordingly, even when the optical axis of the incident beam is shifted from the reference optical path to some degree, the error of the optical path of the output beam relative to the reference optical path is at most the error of the optical path at the incident beam position.

FIG. 24 shows the case where the m stages of laser beam amplifiers are connected in series in the preamplifier 20 of the driver laser apparatus. However, according to need, a relay optics may be provided between the upstream laser beam amplifier 20$k$ and the next laser beam amplifier 20($k$+1). The relay optics transfers an image of the output beam at the second point 35$k$ of the upstream laser beam amplifier 20$k$ to the first point 34($k$+1) of the next laser beam amplifier 20($k$+1) to focus a transfer image. In this manner, the multiple stages of laser beam amplifiers are provided by adjusting the optical axis such that the optical axis of the output laser beam of the laser beam amplifier 20$k$ passes through the first point 34($k$+1) of the next laser beam amplifier 20($k$+1), and thereby, the amplification factor of the preamplifier can be increased while the shift of the optical axis is suppressed.

The main amplifier 60 in the driver laser apparatus according to the fourth embodiment includes n stages of fast-axialflow type laser beam amplifiers according to the second embodiment as shown in FIG. 5 and so on connected in series. In each tubular laser beam amplifier 60i, the optical system is adapted to focus a transfer image of the image of the incident beam at the first point 62i set on the first reflection surface of the right angle prism 61i onto the second point 63i on the second reflection surface of the right angle prism 61i. Accordingly, even when the optical axis of the incident beam is shifted from the reference optical path to some degree, the shift of the output beam at the output beam transfer image position (second point) 63i is at most the error of the optical path at the incident beam position (first point) 62i.

The relay optics 55 adjusts the laser beam reflected by the HR mirror 54 to make the laser beam incident upon the first point of the first laser beam amplifier. Subsequently, in each laser beam amplifier 60i, the image of the incident beam at the first point 62i is transferred to the second point 63i to focus a transfer image. The multiple stages of laser beam amplifiers are provided by adjusting the optical axis such that the image of the output laser beam at the second point 63i of the laser beam amplifier 60i is transferred to the first point 62(i+1) of the next laser beam amplifier 60(i+1) via the relay optics 66i, and thereby, the amplification factor of the main amplifier can be increased and the output of the main amplifier can be made higher while the shift of the optical axis is suppressed.

According to the fourth embodiment, since the multiple stages of laser beam amplifiers are connected in series, although the optical path length within the driver laser apparatus is extremely long, the optical axes in the preamplifier 20 and the main amplifier 60 are stable, and thereby, alignment adjustment of the entire driver laser apparatus is easy and the optical axis of the output laser beam is extremely stable. As a result, the position and shape of the focusing point of the laser beam is stable and the energy stability of EUV light is improved.

In the fourth embodiment, the fast-axial-flow type laser beam amplifiers having tubular shapes are used in the main amplifier 60. However, the present invention is not limited to that, but fast-axial-flow type laser beam amplifiers having elliptical, oval, rectangular, or the like shape, triaxial orthogonal type laser beam amplifiers, or slab type laser beam amplifiers may be used. Further, in the preamplifier 20, fast-axial-flow type laser beam amplifiers or the like may be used.

(Embodiment 5)

Figure 25:
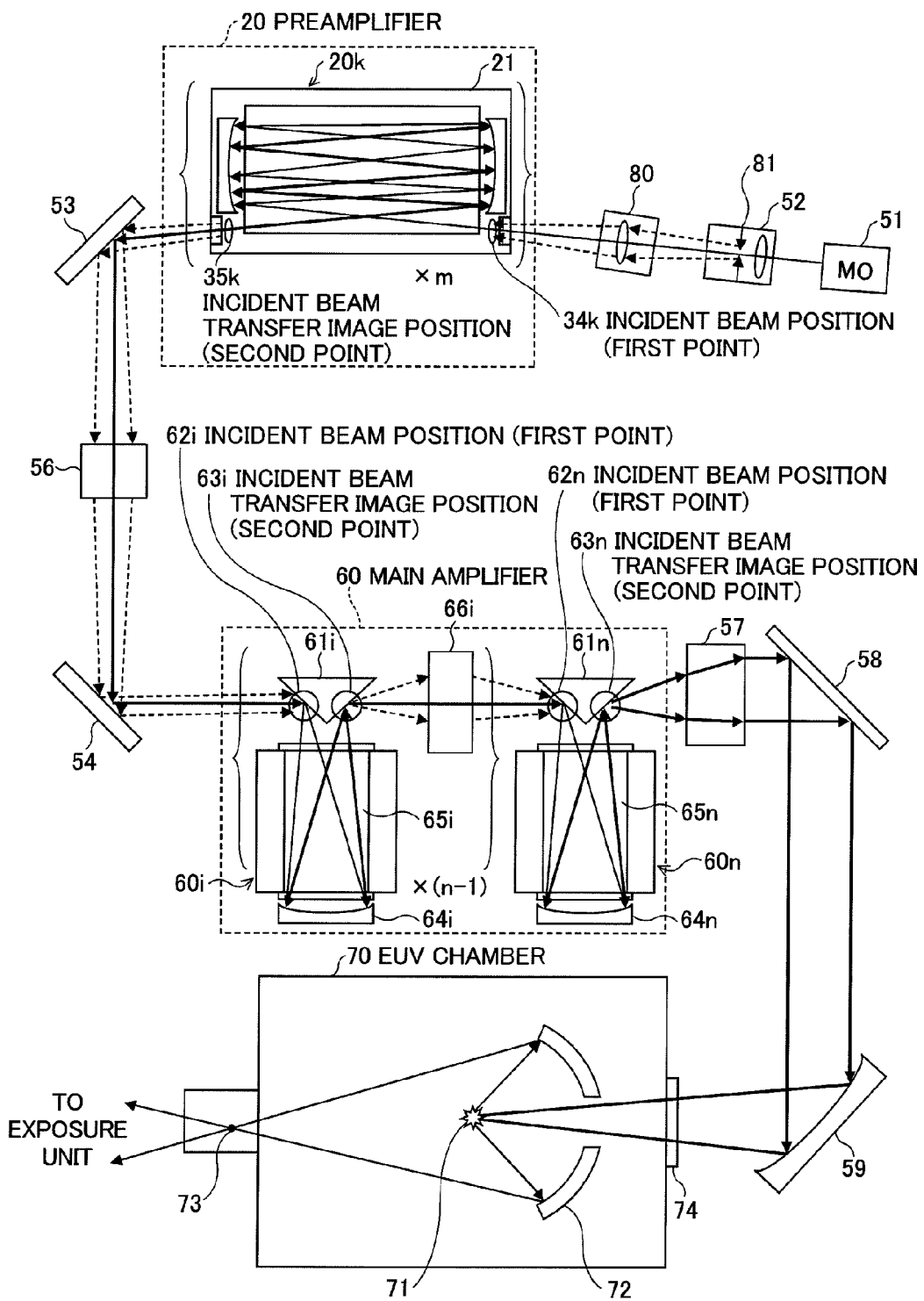
FIG. 25 shows a configuration of an EUV light source apparatus using a driver laser apparatus according to the fifth embodiment of the present invention.
Figure 26:
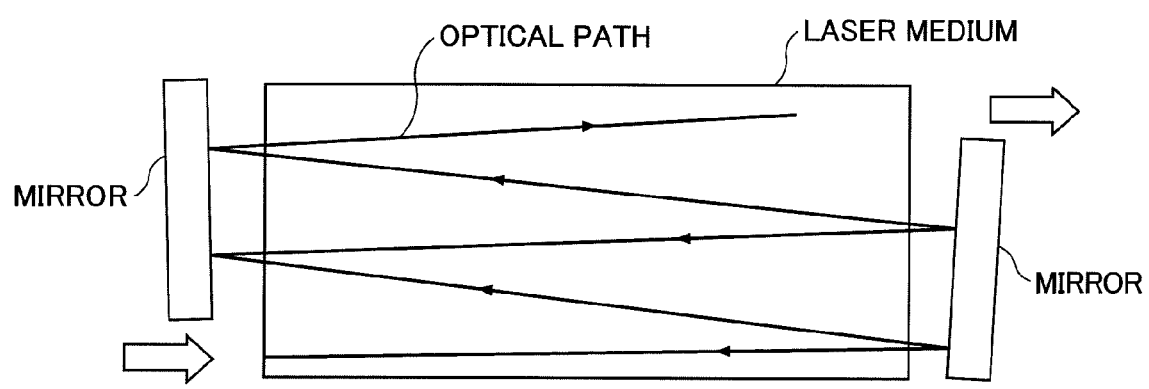
FIG. 26 shows a conventional multipass amplification type laser beam amplifier.
Figure 27:
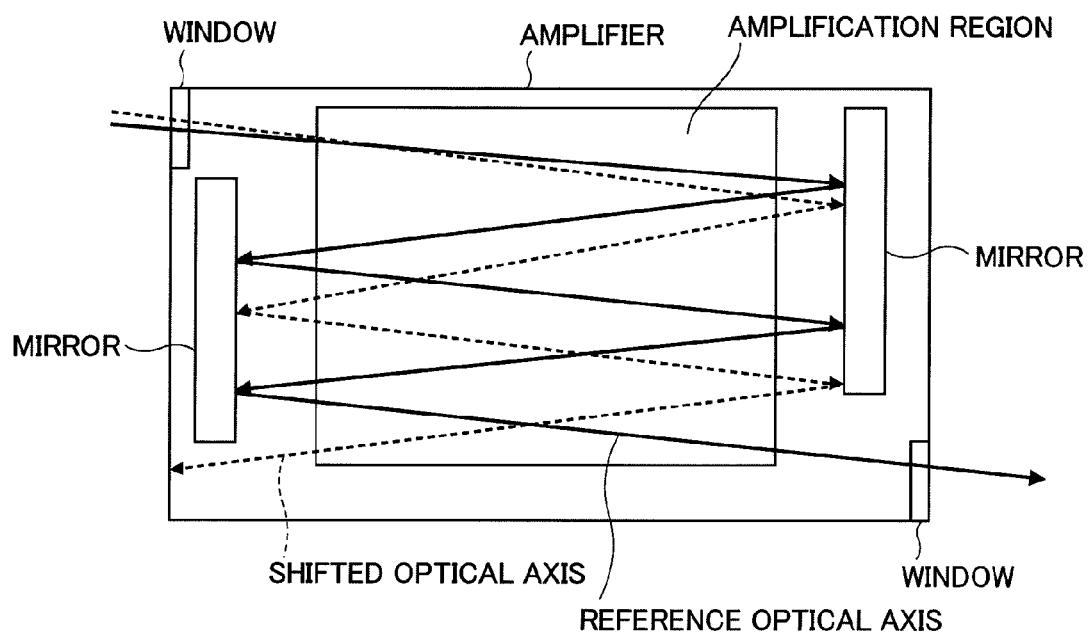
FIG. 27 is a diagram for explanation of a problem in the conventional multipass amplification type laser beam amplifier.

FIG. 25 shows a configuration of an EUV light source apparatus using a driver laser apparatus according to the fifth embodiment of the present invention. As shown in FIG. 25, the driver laser apparatus according to the fifth embodiment includes a master oscillator 51, a spatial filter 52, a relay optics 80, a preamplifier 20 including multiple stages of m laser beam amplifiers, HR mirrors 53, 54 and 58, relay optics 55 and 57, and a main amplifier 60 including multiple stages of n laser beam amplifiers.

The single mode of the seed laser beam outputted from the master oscillator 51 is filtered by the spatial filter 52 in which a pin hole 81 is formed, and the image of the laser beam in the pin hole 81 of the spatial filter 52 is transferred to the first point of the first stage laser beam amplifier of the preamplifier 20 by the relay optics 80, and a transfer image is focused. The operation of the preamplifer 20 is the same as that in the fourth embodiment as shown in FIG. 24.

The image of the laser beam at the second point of the last stage laser beam amplifier of the preamplifier 20 is transferred to the first point of the first stage laser beam amplifier of the main amplifier 60 by the relay optics 56. The operation of the main amplifier 60 is the same as that in the fourth embodiment as shown in FIG. 24. The laser beam amplified by the main amplifier 60 enters the relay optics 57.

The driver laser apparatus according to the fifth embodiment is different from the driver laser apparatus according to the fourth embodiment as shown in FIG. 24 in that the relay optics are inserted in some places so as to form a transfer optics. As shown in FIG. 25, the relay optics 80 inserted between the spatial filter 52 and the preamplifier 20 transfers the image of the laser beam in the pin hole 81 of the spatial filter 52 to the first point of the first stage laser beam amplifier of the preamplifier 20 to focus a transfer image.

Then, the relay optics 56 inserted between the multi-staged preamplifier 20 and the multi-staged main amplifier 60 transfers the image of the laser beam at the second point of the last stage laser beam amplifier of the preamplifier 20 to the first point set on the reflection surface of the right angle prism of the first stage laser beam amplifier of the main amplifier 60 to focus a transfer image.

According to the fifth embodiment, since the relay optics is added, the laser beam can reliably be incident upon the first points of the preamplifier and the main amplifier, and variations of the amplification efficiency of the preamplifier and the main amplifier are suppressed and stable amplification can be performed as the entire laser apparatus.

The invention claimed is:

1. A laser beam amplifier for amplifying an incident laser beam to output the amplified laser beam, the laser beam amplifier comprising:
a container configured to accommodate a laser medium;
an optical system configured to form an optical path between a first point and a second point which are conjugate to each other so as to focus a transfer image of the laser beam incident upon said first point onto a third point in the optical path between said first point and said second point at least once, and then, focus the transfer image onto said second point; and
a pair of electrodes arranged in said container and configured to perform discharge in the laser medium to form an amplification region between said first point and said second point, wherein
said optical system includes at least one concave mirror having a reflection surface facing the amplification region.

2. The laser beam amplifier according to claim 1, wherein said container includes a first window through which the laser beam is incident and a second window through which the laser beam is outputted, and said first point is located near said first window and said second point is located near said second window.

3. The laser beam amplifier according to claim 1, further comprising a radio-frequency power supply configured to apply a radio-frequency voltage between said pair of electrodes, wherein
said pair of electrodes includes a pair of plate electrodes arranged with the laser medium within said container in between.

4. The laser beam amplifier according to claim 1, wherein said optical system further includes one of a planar mirror, a concave mirror, and a convex mirror, which has a reflection surface facing the amplification region.

5. The laser beam amplifier according to claim 1, further comprising:
a saturable absorber provided in an optical path between said first point and said second point.

6. The laser beam amplifier according to claim 1, further comprising:
- a radio-frequency power supply configured to apply a radio-frequency voltage between said pair of electrodes; and
- a gas circulation unit configured to circulate the laser medium in said container.

7. The laser beam amplifier according to claim 1, wherein transfer magnification of said optical system is substantially "1".

8. The laser beam amplifier according to claim 1, wherein the laser medium includes a $CO_2$ laser gas containing carbon dioxide ($CO_2$).

9. The laser beam amplifier according to claim 1, further comprising:
- a radio-frequency power supply configured to apply a radio-frequency voltage between said pair of electrodes, wherein
- said pair of electrodes includes a pair of cylindrical electrodes arranged coaxially.

10. The laser beam amplifier according to claim 6, wherein each of said pair of electrodes has a spiral shape.

* * * * *